US012644048B2

(12) United States Patent
Kim et al.

(10) Patent No.: US 12,644,048 B2
(45) Date of Patent: Jun. 2, 2026

(54) NANOSTRUCTURE INCLUDING QUANTUM DOT, COMPOSITE INCLUDING THE NANOSTRUCTURE, AND DISPLAY PANEL AND ELECTRONIC DEVICE INCLUDING THE COMPOSITE

(71) Applicants: Samsung Electronics Co., Ltd., Suwon-si (KR); Seoul National University R&DB Foundation, Seoul (KR)

(72) Inventors: Tae Gon Kim, Suwon-si (KR); Jwa-Min Nam, Seoul (KR); Minho Kim, Suwon-si (KR); Mi Hye Lim, Suwon-si (KR); Yoonjae Jung, Seoul (KR); Yoonhee Kim, Seoul (KR); Shin Ae Jun, Suwon-si (KR); Jae-Ho Hwang, Yongin-si (KR); Yeonhee Lee, Seoul (KR)

(73) Assignees: SAMSUNG ELECTRONICS CO., LTD, Gyeonggi-Do (KR); SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 777 days.

(21) Appl. No.: 17/953,603

(22) Filed: Sep. 27, 2022

(65) Prior Publication Data

US 2023/0139500 A1 May 4, 2023

(30) Foreign Application Priority Data

Sep. 27, 2021 (KR) ........................ 10-2021-0127032

(51) Int. Cl.
*C09K 11/88* (2006.01)
*C09K 11/02* (2006.01)
(Continued)

(52) U.S. Cl.
CPC ............ *C09K 11/883* (2013.01); *C09K 11/02* (2013.01); *C09K 11/0883* (2013.01);
(Continued)

(58) Field of Classification Search
CPC .................................................... C09K 11/883
See application file for complete search history.

(56) References Cited

U.S. PATENT DOCUMENTS

| | | | |
|---|---|---|---|
| 10,181,565 | B2 | 1/2019 | Gu et al. |
| 10,619,096 | B2 | 4/2020 | Park et al. |

(Continued)

FOREIGN PATENT DOCUMENTS

| | | |
|---|---|---|
| JP | 2007127627 A | 5/2007 |
| JP | 2013057630 A | 3/2013 |

(Continued)

OTHER PUBLICATIONS

D. J. Wu; Y. Cheng; X. W. Wu; X. J. Liu, An active metallic nanomatryushka with two similar super-resonances, Jul. 1, 2014, Journal of Applied Physics, vol. 116, Issue 1, 013502: pp. 1-5, https://doi.org/10.1063/1.4886696 (Year: 2014).*

(Continued)

*Primary Examiner* — Brent A. Fairbanks
*Assistant Examiner* — Krishna J Palaniswamy
(74) *Attorney, Agent, or Firm* — CANTOR COLBURN LLP

(57) ABSTRACT

A nanostructure including a metal core, a metal shell surrounding the metal core, and a dielectric layer disposed between the metal core and the metal shell and including a quantum dot, a composite including the nanostructure, a display panel including the composite, and an electronic device including the display panel.

18 Claims, 20 Drawing Sheets

(51) Int. Cl.

| | |
|---|---|
| ***C09K 11/08*** | (2006.01) |
| ***G02F 1/13357*** | (2006.01) |
| ***H10K 59/38*** | (2023.01) |
| *B82Y 20/00* | (2011.01) |
| *B82Y 40/00* | (2011.01) |

(52) U.S. Cl.

CPC ....... *G02F 1/133617* (2013.01); *H10K 59/38* (2023.02); *B82Y 20/00* (2013.01); *B82Y 40/00* (2013.01)

(56) References Cited

U.S. PATENT DOCUMENTS

| | | | | |
|---|---|---|---|---|
| 11,060,021 | B2 | 7/2021 | Nam et al. | |
| 2007/0099238 | A1 | 5/2007 | Sigalas et al. | |
| 2012/0193605 | A1 | 8/2012 | Gillies et al. | |
| 2017/0052444 | A1 | 2/2017 | Park et al. | |
| 2018/0008730 | A1* | 1/2018 | Halas | A61K 49/1833 |
| 2019/0128894 | A1 | 5/2019 | Jain et al. | |
| 2019/0211265 | A1* | 7/2019 | Park | G02B 6/0229 |
| 2021/0023626 | A1 | 1/2021 | Nam et al. | |

FOREIGN PATENT DOCUMENTS

| | | | |
|---|---|---|---|
| JP | 2020003608 | A | 1/2020 |
| KR | 20120077235 | A | 7/2012 |
| KR | 101339099 | B1 | 12/2013 |
| KR | 101597894 | B1 | 2/2016 |
| KR | 101784085 | B1 | 11/2017 |
| KR | 20190085495 | A | 7/2019 |
| KR | 20200018985 | A | 2/2020 |
| KR | 102202503 | B1 | 1/2021 |

OTHER PUBLICATIONS

Ying Hu 1, Ryan C Fleming, Rebekah A Drezek, Optical properties of gold-silica-gold multilayer nanoshells, Nov. 12, 2008, Optical Express, vol. 16, Issue 24, 19579-19591, https://doi.org/10.1364/OE.16.019579 (Year: 2008).*

Journal of Applied Physics, “An active metallic nanomatryushka with two similar super-resonances”, D. J. Wu, Y. Cheng, W. Wu, and X. J. Liu, Jul. 1, 2014 (Year: 2014).*

Optical properties of gold-silica-gold multilayer nanoshells, Ying Hu, Ryan C. Fleming, and Rebekah A. Drezek, Nov. 24, 2008 (Year: 2008).*

Jeong-Eun Park et al., “Precisely Shaped, Uniformly Formed Gold Nanocubes with Ultrahigh Reproducibility in Single-Particle Scattering and Surface-Enhanced Raman Scattering,” Nano Letters, Aug. 28, 2018, pp. 6475-6482, vol. 18.

Office Action dated Apr. 20, 2023 of the corresponding Korean Patent Application No. 10-2021-0127032.

* cited by examiner

2000

NANOSTRUCTURE INCLUDING QUANTUM DOT, COMPOSITE INCLUDING THE NANOSTRUCTURE, AND DISPLAY PANEL AND ELECTRONIC DEVICE INCLUDING THE COMPOSITE

CROSS-REFERENCE TO RELATED APPLICATION

This application claims priority to and the benefit of Korean Patent Application No. 10-2021-0127032 filed in the Korean Intellectual Property Office on Sep. 27, 2021, and all the benefits accruing therefrom under 35 U.S.C. § 119, the entire content of which is incorporated herein by reference.

BACKGROUND

1. Field

A nanostructure including quantum dots, a composite including the nanostructure, a display panel, and an electronic device are disclosed.

2. Description of the Related Art

Quantum dots are nano-sized semiconductor nanocrystalline materials, the optical properties, for example, luminescent properties, of which can be controlled by changing the size thereof, the composition thereof, or a combination thereof. Luminescent properties of quantum dots may be applied to, e.g., used in, various electronic devices, for example, display devices. Quantum dots that are environmentally friendly and are capable of exhibiting improved physical properties when applied to, e.g., used in, for example, electronic devices have been developed, but there is a need to further improve light absorption characteristics and luminescent characteristics.

SUMMARY

An embodiment relates to a nanostructure including a quantum dot capable of simultaneously increasing an absorption and light conversion efficiency of the quantum dot by increasing an excitation rate and a light emission rate (radiative decay rate) of the quantum dot.

An embodiment relates to a composite including a polymer matrix and a plurality of the nanostructures dispersed in the polymer matrix.

An embodiment relates to a display panel including the composite.

An embodiment relates to an electronic device including the display panel.

A nanostructure according to an embodiment includes a metal core, a metal shell surrounding the metal core, and a dielectric layer disposed between the metal core and the metal shell and including a quantum dot.

A size of the metal core may be about 5 nanometers (nm) to about 100 nm, a thickness of the dielectric layer may be about 10 nm to about 100 nm, and a thickness of the metal shell may be about 10 nm to about 100 nm.

The size of the metal core may be about 15 nm to about 50 nm, the thickness of the dielectric layer may be about 10 nm to about 50 nm, and the thickness of the metal shell may be about 15 nm to about 50 nm.

The metal core and the metal shell may each independently include a metal that is gold, silver, platinum, copper, palladium, aluminum, or an alloy of two or more thereof.

The dielectric layer may further include a metal oxide or an organic polymer.

The metal oxide may include $SiO_2$, $TiO_2$, $ZrO_2$, $Al_2O_3$, $Cu_xO$ ($0<x<2$), or a combination thereof.

The quantum dot may have an emission peak wavelength of about 510 nm to about 550 nm.

The quantum dot may have an emission peak wavelength of about 600 nm to about 650 nm.

The nanostructure may have an absorption peak or absorption edge in the wavelength range of about 400 nm to about 550 nm.

The quantum dot may include Group 3 element and a Group 5 element of the periodic table of elements and may not include cadmium.

The quantum dot may have a core-shell structure including a core including the Group 3 element and the Group 5 element of the periodic table of elements, and a shell disposed on the core and including a Group 2 element and a Group 6 element of the periodic table of elements.

The quantum dot may have a core-shell structure including a core including a semiconductor nanocrystal including indium and phosphorus, and a shell disposed on the core and including a semiconductor nanocrystal including zinc and selenium.

The semiconductor nanocrystal forming the shell may further include sulfur.

The quantum dot may include an organic ligand on the surface, and the organic ligand includes a compound having a carboxyl group at a terminal end, a compound having a hydroxy group at a terminal end, or a combination thereof.

An average particle size of the quantum dot may be greater than or equal to about 5.5 nm.

A composite according to an embodiment includes a polymer matrix and a plurality of nanostructures dispersed in the polymer matrix, wherein the plurality of nanostructures include the nanostructure according to an embodiment.

A display panel according to an embodiment includes a color conversion layer including a plurality of regions including a color conversion region, and the composite of the nanostructures is disposed in the color conversion region.

The display panel may further include a light emitting panel including a light emitting source, and the color conversion region may include a first color conversion region configured to convert light emitted from the light emitting panel into light having a first emission spectrum.

The color conversion region may further include a second color conversion region configured to convert light emitted from the light emitting panel into light having a second emission spectrum different from the first emission spectrum.

The first emission spectrum may be a green emission spectrum having an emission peak wavelength between about 500 nm and about 550 nm, and the second emission spectrum may be a red emission spectrum having an emission peak wavelength between about 600 nm and about 650 nm.

An electronic device according to an embodiment includes the display panel.

A method of manufacturing a nanostructure according to an embodiment includes forming a first silica dielectric layer on a nano-sized metal core; adding a plurality of quantum dots to the first silica dielectric layer; forming a second silica dielectric layer on the quantum dots; and forming a metal shell on the second silica dielectric layer to manufacture the nanostructure.

A nanostructure according to an embodiment includes a nano-sized metal core, a metal shell surrounding the metal core, and a quantum dot in a dielectric layer formed in a gap between the metal core and the metal shell, and a plasmonic effect of the metal core and the metal shell around, e.g., surrounding, the dielectric layer including the quantum dot is maximized around, e.g., on, the dielectric layer where, e.g., in which, the quantum dot is present. Excitation energy of the quantum dot included in the nanostructure may increase, a light absorption of the quantum dot may increase, and the luminescent characteristics of the quantum dot may be improved. As described herein, the nanostructures including the quantum dot with improved light absorption and luminescence characteristics may be dispersed in a polymer matrix to form various display devices in the form of a composite, and may be advantageously applied to, e.g., used in, for example, biological labeling such as a biosensor or bioimaging, a photodetector, a solar cell, a hybrid composite, or the like.

BRIEF DESCRIPTION OF THE DRAWINGS

The above and other advantages and features of this disclosure will become apparent by describing in further detail exemplary embodiments thereof with reference to the accompanying drawings, in which.

DETAILED DESCRIPTION

Figure 1:
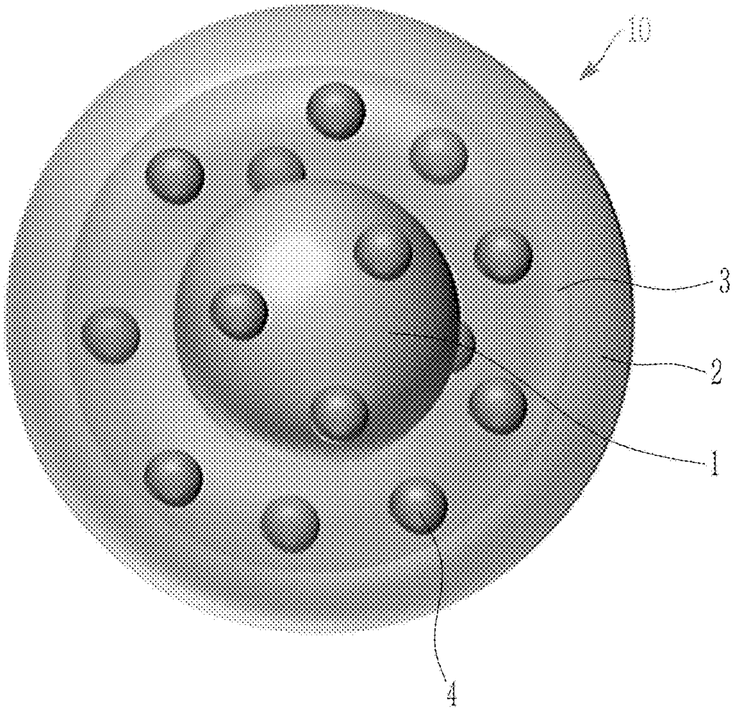
FIG. 1 is a schematic view of a nanostructure according to an embodiment.

Advantages and characteristics of this disclosure, and a method for achieving the same, will become evident referring to the following embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used, e.g., non-technical, dictionary may not be interpreted ideally or exaggeratedly unless clearly defined. In addition, unless explicitly described to the contrary, the word "comprise," and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third," etc., may be used herein to describe various elements, components, regions, layers, and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations or within +20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated May be rounded. Thus, the regions illustrated in the figures are schematic in nature and their shapes are not intended to illustrate the precise shape of a region and are not intended to limit the scope of the present claims.

Further, the singular includes the plural unless mentioned otherwise. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

As used herein, a number of carbon atoms in a group or a molecule may be referred to as a subscript (e.g., $C_{6-50}$) or as C6 to C50.

Hereinafter, as used herein, when a definition is not otherwise provided, "substituted" refers to replacement of a hydrogen of a compound or the corresponding moiety by a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br or —I), a hydroxy group (—OH), a nitro group ($—NO_2$), a cyano group (—CN), an amino group (—NRR', wherein R and R' are each independently hydrogen or C1 to C6 alkyl group), an azido group ($—N_3$), an amidino group ($—C(=NH)NH_2$), a hydrazino group ($—NHNH_2$), a hydrazono group ($=N(NH_2)$), an aldehyde group (—C(=O)H), a carbamoyl group ($—C(O)NH_2$), a thiol group (—SH), an ester group (—C(=O) OR, wherein R is a C1 to C6 alkyl group or a C6 to C12 aryl group), a carboxyl group (—COOH) or a salt thereof (—C(=O)OM, wherein M is an organic or inorganic cation), a sulfonic acid group ($—SO_3H$) or a salt thereof ($—SO_3M$, wherein M is an organic or inorganic cation), a phosphoric acid group ($—PO_3H_2$) or a salt thereof ($—PO_3MH$ or $—PO_3M_2$, wherein M is an organic or inorganic cation), or a combination thereof. The total number of carbon atoms in a compound, moiety, or group is inclusive of any substituents, e.g., a cyanoethyl group is a C3 alkyl group.

As used herein, when a definition is not otherwise provided, "hydrocarbon" or "hydrocarbon group" refers to a group including, e.g., containing, carbon and hydrogen (e.g., an aliphatic group such as alkyl, alkenyl, alkynyl, or an aromatic group such as an aryl group). The hydrocarbon group may be a monovalent group or a group having a valence of greater than one formed by removal of a, e.g., one or more, hydrogen atoms from, alkane, alkene, alkyne, or arene. In the hydrocarbon group, a, e.g., at least one, methylene may be replaced by an oxide moiety, a carbonyl moiety, an ester moiety, —NH—, or a combination thereof. Unless otherwise stated to the contrary, the hydrocarbon (alkyl, alkenyl, alkynyl, or aryl) group may have 1 to 60, 2 to 32, 3 to 24, or 4 to 12 carbon atoms.

As used herein, when a definition is not otherwise provided, "monovalent organic functional group" for example, "monovalent organic acids," refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, "hetero" refers to inclusion of a, e.g., at least one, heteroatom, for example, one to three heteroatoms, of N, O, S, Si, or P.

As used herein, when a definition is not otherwise provided, "alkenyl" refers to a linear or branched monovalent hydrocarbon group having a, e.g., one or more, carbon-carbon double bond. Unless specified otherwise, an alkenyl group has from 2 to 50 carbon atoms, or 2 to 18 carbon atoms, or 2 to 12 carbon atoms.

As used herein, when a definition is not otherwise provided, "alkoxy" refers to an alkyl group linked via an oxygen (i.e., alkyl-O—), such as a methoxy, ethoxy, or sec-butyloxy group.

As used herein, when a definition is not otherwise provided, "alkyl" refers to a linear or branched saturated monovalent hydrocarbon group (methyl, ethyl hexyl, etc.). Unless specified otherwise, an alkyl group has from 1 to 50 carbon atoms, or 1 to 18 carbon atoms, or 1 to 12 carbon atoms.

As used herein, when a definition is not otherwise provided, "alkylene group" refers to a straight or branched saturated aliphatic hydrocarbon group having at least two valences and optionally substituted with a, e.g., at least one, substituent.

As used herein, when a definition is not otherwise provided, "alkynyl" refers to a linear or branched monovalent hydrocarbon group having a, e.g., one or more, carbon-carbon triple bond. Unless specified otherwise, an alkenyl group has from 2 to 50 carbon atoms, or 2 to 18 carbon atoms, or 2 to 12 carbon atoms.

As used herein, when a definition is not otherwise provided, "amine" or "amine group" may be —NRR, (each R is independently hydrogen, a C1-C12 alkyl group, a C7-C20 alkylarylene group, a C7-C20 arylalkylene group, or a C6-C18 aryl group).

As used herein, when a definition is not otherwise provided, "aryl" refers to a group formed by removal of a, e.g., at least one, hydrogen from an aromatic group (e.g., a phenyl or naphthyl group). Unless specified otherwise, an aryl group has from 6 to 50 carbon atoms, or 6 to 18 carbon atoms, or 6 to 12 carbon atoms.

As used herein, when a definition is not otherwise provided, "arylene group" refers to a functional group having at least two valences obtained by removal of at least two hydrogens in a, e.g., at least one, aromatic ring, and optionally substituted with a, e.g., at least one, substituent.

As used herein, when a definition is not otherwise provided, "aliphatic" or "aliphatic group" refers to a saturated or unsaturated linear or branched C1 to C30 group consisting of carbon and hydrogen.

As used herein, when a definition is not otherwise provided, "aromatic" or "aromatic organic group" includes a C6 to C30 aryl group or a C2 to C30 heteroaryl group.

As used herein, when a definition is not otherwise provided, "(meth)acrylate" refers to acrylate, methacrylate, or a combination thereof. The (meth)acrylate may include a (C1 to C10 alkyl) acrylate, a (C1 to C10 alkyl) methacrylate, or a combination thereof.

As used herein, "light conversion rate" is a ratio of the emission amount (G or R) of the quantum dot composite (single film) to the light amount absorbed from the excitation light (e.g., blue light) (B) of the quantum dot composite, that is, a light amount (B-B') obtained by subtracting the amount of light (B') emitted to the outside through the single film from the excitation light (B). In addition, the "light conversion efficiency" is a ratio of the emission amount (G or R) of the quantum dot composite to the emission amount (B) of the excitation light. The total light amount (B) of excitation light is obtained by integrating a photoluminescent (PL) spectrum, the PL spectrum of the quantum dot composite film is measured, a light amount (G or R) in a green or red wavelength emitted from the quantum dot composite film and a light amount (B') of excitation light passing through the single film are obtained, and light conversion rate, light conversion efficiency, and blue light absorption are obtained by the following equations:

$$A/(B-B')\times 100=\text{light conversion rate (\%)}$$

$$A/B\times 100=\text{light conversion efficiency (\%)}$$

$$(B-B')/B\times 100=\text{blue light absorption (\%) of single film}$$

As used herein, when a definition is not otherwise provided, a "dispersion" includes a solid dispersed phase and a continuous liquid phase. The "dispersion" may include a colloidal dispersion wherein the dispersed phase has a dimension of greater than or equal to about 1 nm, for example, greater than or equal to about 2 nm, greater than or equal to about 3 nm, or greater than or equal to about 4 nm and several micrometers (μm) or less, (e.g., about 2 μm or less or about 1 μm or less).

Herein, "quantum dots" refer to nanostructures that exhibit quantum confinement or exciton confinement, such as semiconductor-based nanocrystals (particles), for example, luminescent nanostructure (e.g., capable of emitting light by energy excitation). As used herein, "quantum dots" are not limited in shapes thereof, unless otherwise defined.

Herein, "a dimension (e.g., size, diameter, thickness, etc.)" may be an average dimension (e.g., size, diameter, thickness, etc.). Herein, the "average" may be mean or median. The dimension may be a value obtained by electron microscopic analysis. The dimension may be a value calculated taking into consideration the composition and optical properties (e.g., ultraviolet (UV) absorption wavelength) of the quantum dots.

Herein, "quantum efficiency (or quantum yield)" may be measured in a solution state or in a solid state (in a composite). In an embodiment, quantum efficiency (or quantum yield) is the ratio of photons emitted to photons absorbed by the nanostructure or population thereof. In an embodiment, quantum efficiency may be measured by any suitable method. For example, for fluorescence quantum yield or efficiency, there may be two methods: an absolute method and a relative method. In the absolute method, quantum efficiency is obtained by detecting the fluorescence of all samples through an integrating sphere. In the relative method, the quantum efficiency of the unknown sample is calculated by comparing the fluorescence intensity of a standard dye (standard sample) with the fluorescence intensity of the unknown sample. Coumarin 153, Coumarin 545, Rhodamine 101 inner salt, Anthracene and Rhodamine 6G may be used as standard dyes according to the PL wavelengths thereof, but the present disclosure is not limited thereto.

Unless otherwise stated, numerical ranges stated herein are inclusive of the endpoint of each range.

As used herein, the upper and lower endpoints set forth for various numerical values may be independently combined to provide a range.

Numerical values state herein are exact values unless explicitly preceded by the term "about."

The quantum efficiency (or quantum yield) may be reproducibly determined using suitable, e.g., commercially available, equipment, for example, from Hitachi or Hamamatsu, and referring to manuals provided by, for example, respective equipment manufacturers.

The full width at half maximum (FWHM) and photoluminescence (PL) peak wavelength may be measured, for example, by an emission spectrum obtained by a spectrophotometer such as a fluorescence spectrophotometer or the like.

Herein, a description of not including cadmium (or other toxic heavy metals or given elements) means that a concentration of cadmium (or the other heavy metals or given elements) is less than or equal to about 100 parts per million by weight (ppmw), less than or equal to about 50 ppmw, less than or equal to about 10 ppmw, or about zero. In an embodiment, substantially no cadmium (or its heavy metal) is present, or, if present, in an amount below the detection limit of a given detection means or at an impurity level.

The quantum dots have a large surface area per unit volume, exhibit a quantum confinement effect, and may exhibit properties different from those of bulk materials having the same composition. The quantum dots absorb light from an excitation source to be in an excited state, and emit energy corresponding to the bandgap energies thereof.

The quantum dots may be applied, e.g., used, as light emitting materials in display devices. For example, a quantum dot composite including a plurality of quantum dots dispersed in a polymer matrix or the like may be used as a light conversion layer (e.g., a color conversion layer) that converts a light (e.g., blue light) of a desired wavelength, for example, green light or red light from a light source (e.g., a backlight unit (BLU)), an organic light emitting diode (OLED), alight conversion layer (e.g., a color conversion layer) that converts excitation light (e.g., blue light) from a micro light emitting diode (μLED), a mini light emitting diode (miniLED), etc.) in a display device. That is, unlike an absorption type color filter, a patterned film including the quantum dot composite may be used as an emission type color filter. An emission type color filter may be disposed in front of the display device, and, for example, when excitation light, which has linearity while passing through the liquid crystal layer, reaches the emission type color filter, is the excitation light may be scattered in all directions to realize a wider viewing angle, and light loss due to, for example, an absorption type color filter may be avoided. A display device including a quantum dot-based emission type color filter, for example, a liquid crystal display, may further include a polarizer inside the panel, for example, under the color filter. The display device may further include a yellow-recycling film (YRF) configured to recycle light and an excitation light blocker (e.g., a blue-cut filter or a green light cut filter) according to an option.

Quantum dots having properties applicable to, e.g., usable in, electronic devices and the like may be cadmium-based quantum dots. However, cadmium may cause a serious environment/health problem and is a restricted element. A cadmium-free quantum dot may be for example a Group III-V-based nanocrystal. However, cadmium-free quantum dots may have problems with low absorption of excitation light of individual quantum dots, and a quantum dot color filter may not sufficiently absorb blue light, and may exhibit relatively low light conversion efficiency and wide full width at half maximum of the emission spectrum. InP-based quantum dots are do not contain heavy metals such as cadmium (Cd) or lead (Pb), exhibit high quantum efficiency of over 90%, and may be mass-produced in industry. InP-based quantum dots do not face commercialization problems in terms of luminous efficiency, luminescence full width at half maximum, and stability, except for low light absorption characteristics. Therefore, there is a need to improve the low light absorption characteristics of InP-based quantum dots.

The present inventors developed a method for simultaneously increasing the absorption and light conversion efficiency of quantum dots by applying the plasmonic nanostructure to the quantum dots and increasing the excitation rate and light emission rate (radiative decay rate) of the quantum dots.

A structure in which quantum dots are placed on the surface of metal nanoparticles through a dielectric layer (refer to U.S. Pat. No. 10,181,565 B2), or a structure in which, after coating quantum dots with a dielectric layer, a metal shell is formed on the surface (refer to US2019/0128894A1), are examples of applying a plasmonic nanostructure to quantum dots.

The present inventors developed a new nanostructure having a new structure and that can maximize the plasmon effect. FIG. 1 is a schematic view of a nanostructure according to an embodiment.

Referring to FIG. 1, the nanostructure 10 according to an embodiment includes a metal core 1, a metal shell 2 surrounding the metal core 1, and a dielectric layer 3 disposed between the metal core 1 and the metal shell 2 and including quantum dots 4. That is, the nanostructure 10 according to an embodiment has a structure in which the dielectric layer 3 is disposed in the gap between the metal core 1 and the metal shell 2, and the quantum dots 4 are present in the dielectric layer 3.

Figure 2:
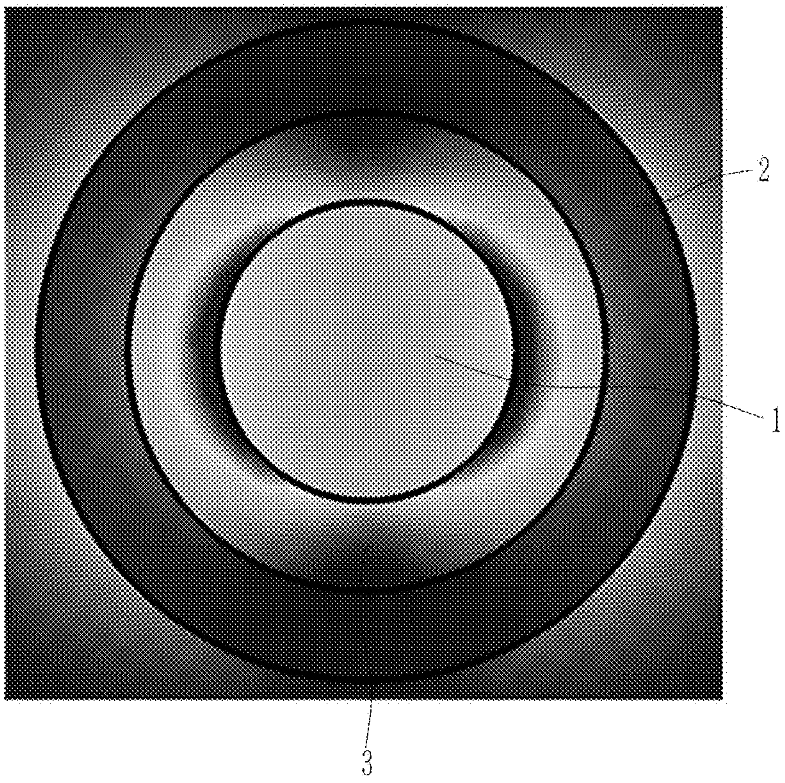
FIG. 2 is a schematic view illustrating a distribution of an electric field of a nanostructure according to an embodiment.

In the nanostructure according to an embodiment, the excitation energy of the quantum dots may increase due to, for example, the strong electric field enhancement characteristics inside the metal core 1 and the metal shell 2, and the quantum dots may have a higher light absorption. In addition, as the quantum dots have a higher light absorption, the quantum dots have better luminescent characteristics. The improved light absorption characteristics and luminescent characteristics are superior to quantum dots to which a metal surface plasmon effect may be applied. FIG. 2 is a schematic view illustrating a distribution of an electric field of a nanostructure according to an embodiment.

Referring to FIG. 2, the electric field is strongly concentrated on the surface of the metal core 1 and the dielectric layer 3 that is inside the metal shell 2.

Figure 3:
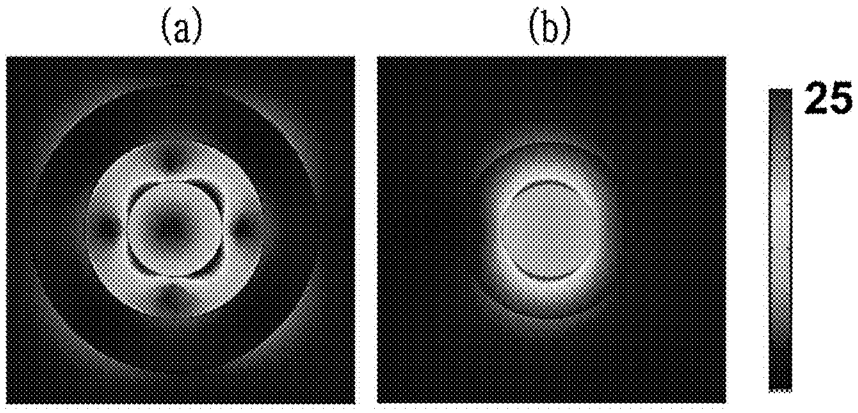
FIG. 3 is a schematic view showing the results of simulating the photoluminescence enhancement effect of both nanostructures when irradiating blue light having an emission peak of about 450 nm wavelength, respectively to the nanostructure (a) according to an embodiment and the nanostructure (b) according to Comparative Example 1 having the same metal core and the dielectric layer of the same thickness but not including the metal shell.

As seen from Example 1 and Comparative Example 1 to be described herein, when comparing the distribution degrees of the electric field of the nanostructure of Example 1 (shown in (a) of FIG. 3) and unlike the nanostructure of Example 1, the nanostructure according to Comparative Example 1 (shown in (b) of FIG. 3) including only a metal core and a dielectric layer surrounding the metal core without including an outer metal shell, the distribution degree of the electric field of the nanostructure of Example 1 is at least 2 times or more, for example, 3 times or more, or 4 times or more stronger. Accordingly, the excitation energy of the quantum dots included in the dielectric layer in the nanostructure of Example 1 may be significantly higher than that of the nanostructure of Comparative Example 1. When excitation light is irradiated to each nanostructure, the light absorption of the quantum dots included in the nanostructure according to an embodiment may be much higher. When the light 10) absorption of the quantum dots improve, luminescent characteristics of the nanostructures including the quantum dots may also improve.

As can be seen in FIG. 3, an intensity of the electric field is different depending on a distance from the surface of the metal core of the nanostructure where the quantum dot is present in the dielectric layer, and the light absorption and photoluminescence enhancement effect of the quantum dot may be different according to, e.g., depending on, the position where the quantum dot is present in the dielectric layer. Accordingly, in examples to be described herein, while maintaining a constant size of the metal core 1 of the nanostructure and changing a thickness of the dielectric layer 3 and the thickness of the metal shell 2, the electric field enhancement degree of the nanostructure, i.e., $|E|/|E_0|$ (wherein, $|E_0|$ is the electric field intensity of the incident light, and $|E|$ is the electric field intensity enhanced by the nanostructure) is simulated. As a result, it is confirmed that the electric field enhancement degree varies according to the thickness of the metal shell and the thickness of the dielectric layer of the nanostructure. Accordingly, photoluminescence enhancement factors $(|E|^2/|E_0|^2)\times QE$ of quantum dots included in nanostructures having different dielectric layers and metal shell thicknesses, wherein $|E|$ and $|E_0]$ are the same as described herein, and QE is the quantum efficiency of quantum dots) are simulated. As a result, by adjusting the thicknesses of the metal shell and dielectric layer of the nanostructure, the electric field enhancement effect of the nanostructure may be controlled, and the light absorption of the quantum dots included in the nanostructure may be increased, thereby improving the luminescent characteristics.

As the thickness of the metal shell 2 and the thickness of the dielectric layer 3 of the nanostructure are changed, a level of the photoluminescence enhancement effect may be changed. For example, as the thicknesses of the metal shell 2 and the dielectric layer 3 of the nanostructure according to an embodiment are adjusted to a specific range due to, for example, the specific structure as described herein, a high level of scattering cross section for light in the wavelength range from about 400 nm to about 550 nm may be formed. Accordingly, the nanostructure may have an absorption peak or an absorption edge for light in a wavelength range of about 400 nm to about 550 nm, and the blue light absorption of the quantum dots included in the nanostructure may improve. Therefore, the quantum dots included in the nanostructure according to an embodiment may have a higher blue light absorption than in the state not included in the nanostructure, thereby exhibiting excellent luminescent characteristics, such as, for example, a higher light conversion efficiency.

The nanostructure according to an embodiment improves the light absorption of quantum dots having a low light absorption, such as cadmium-free quantum dots, and excellent luminescent characteristics may be implemented, e.g., exhibited. In addition, by controlling the thicknesses of the dielectric layer and the metal shell in the nanostructure, the light absorption and luminescent characteristics may be controlled.

In the nanostructure according to an embodiment, the size of the metal core may be about 5 nm to about 100 nm, the thickness of the dielectric layer may be about 10 nm to about 100 nm, and the thickness of the metal shell may be about 10 nm to about 100 nm, but each or all of the metal core, the dielectric layer, and the metal shell are not limited to this combination of ranges.

In the nanostructure according to an embodiment, the size of the metal core may have any suitable size that is within a range that the nanostructure is, e.g., allowing the nanostructure to be, capable of causing an appropriate plasmon phenomenon while having a size of a nanometer level, e.g., nano-sized, and the metal core may be present in a stable state and the dielectric layer and the metal shell can be sequentially formed thereon. For example, the size of the metal core may be about 5 nm to about 100 nm, about 10 nm to about 100 nm, about 10 nm to about 90 nm, about 10 nm to about 80 nm, about 10 nm to about 70 nm, about 10 nm to about 65 nm, about 10 nm to about 60 nm, about 10 nm to about 55 nm, about 10 nm to about 50 nm, about 15 nm to about 80 nm, about 15 nm to about 70 nm, about 15 nm to about 60 nm, about 15 nm to about 55 nm, about 15 nm to about 50 nm, about 15 nm to about 45 nm, about 15 nm to about 40 nm, about 20 nm to about 70 nm, about 20 nm to about 60 nm, about 20 nm to about 55 nm, about 20 nm to about 50 nm, about 20 nm to about 45 nm, about 25 nm to about 70 nm, about 25 nm to about 60 nm, about 25 nm to about 55 nm, about 25 nm to about 50 nm, about 25 nm to about 45 nm, about 25 nm to about 40 nm, about 30 nm to about 70 nm, about 30 nm to about 60 nm, about 30 nm to about 55 nm, about 30 nm to about 50 nm, about 30 nm to about 45 nm, or about 35 nm to about 45 nm, but is not limited thereto.

In the nanostructure according to an embodiment, the thickness of the metal shell may have any suitable thickness that is within a range that the nanostructure has, e.g., allowing the nanostructure to have, a size in a nanometer level e.g., nano-sized, and can cause an appropriate plasmon phenomenon, and the metal shell may be present in a stable state while enclosing the dielectric layer as a whole. For example, the thickness of the metal shell may be about 10 nm to about 100 nm, about 10 nm to about 90 nm, about 10 nm to about 80 nm, about 10 nm to about 70 nm, about 10 nm to about 60 nm, about 10 nm to about 50 nm, about 10 nm to about 40 nm, about 10 nm to about 30 nm, about 10 nm to about 25 nm, about 10 nm to about 20 nm, about 15 nm to about 60 nm, about 15 nm to about 50 nm, about 15 nm to about 40 nm, about 15 nm to about 30 nm, about 15 nm to about 25 nm, about 20 nm to about 70 nm, about 20 nm to about 60 nm, about 20 nm to about 50 nm, about 20 nm to about 40 nm, about 20 nm to about 35 nm, about 20 nm to about 30 nm, about 25 nm to about 60 nm, about 25 nm to about 50 nm, about 25 nm to about 45 nm, about 25 nm to about 40 nm, or about 25 nm to about 35 nm, but is not limited thereto.

In the nanostructure according to an embodiment, the thickness of the dielectric layer between the metal core and the metal shell may have any suitable thickness that is within a range that the nanostructure has, e.g., allowing the nanostructure to have, a size in a nanometer level e.g., nano-sized, and can cause an appropriate plasmon phenomenon, and quantum dots are stably included in the dielectric layer. For example, the dielectric layer may have a thickness range such that the quantum dots present therein may be embedded in a form in which the entireties of the quantum dots are stably present in the dielectric layer without a portion of the quantum dots protruding out of, e.g., from, the dielectric layer. For example, the thickness of the dielectric layer may be about 10 nm to about 100 nm, about 10 nm to about 90 nm, about 10 nm to about 80 nm, about 10 nm to about 70 nm, about 10 nm to about 60 nm, about 10 nm to about 50 nm, about 10 nm to about 40 nm, about 10 nm to about 30 nm, about 10 nm to about 25 nm, about 10 nm to about 20 nm, about 15 nm to about 55 nm, about 15 nm to about 50 nm, about 15 nm to about 45 nm, about 15 nm to about 40 nm, about 15 nm to about 35 nm, about 15 nm to about 30 nm, about 15 nm to about 25 nm, about 20 nm to about 60 nm, about 20 nm to about 50 nm, about 20 nm to about 40 nm, about 20 nm to about 35 nm, about 20 nm to about 30 nm, or about 20 nm to about 25 nm, but is not limited thereto.

In an embodiment, the size of the metal core may be about 15 nm to about 50 nm, the thickness of the dielectric layer may be about 10 nm to about 50 nm, and the thickness of the metal shell may be about 15 nm to about 50 nm, but each or all of the metal core, the dielectric layer, and the metal shell are not limited to this combination of ranges. According to the types of materials constituting the metal core, the metal shell, and the dielectric layer, the size of the metal core, the thickness of the dielectric layer, and the thickness of the metal shell may be selected within an appropriate range capable of exhibiting a desirable plasmon phenomenon.

For example, the size of the metal core may be about 25 nm to about 50 nm, the thickness of the dielectric layer may be about 10 nm to about 30 nm, and the thickness of the metal shell may be about 15 nm to about 35 nm, for example, the size of the metal core may be about 30 nm to about 45 nm, the thickness of the dielectric layer may be about 15 nm to about 25 nm, and the thickness of the metal shell may be about 15 nm to about 30 nm, but each or all of the metal core, the dielectric layer, and the metal shell are not limited to this combination of ranges.

The metal core and the metal shell may each independently include any suitable metal exhibiting a plasmon phenomenon, for example, gold, silver, copper, platinum, palladium, aluminum, or an alloy of two or more thereof. In an embodiment, each of the metal core and the metal shell may include silver, but is not limited thereto.

The dielectric layer may further include a metal oxide including $SiO_2$, $TiO_2$, $ZrO_2$, $Al_2O_3$, $Cu_xO$ ($0<x<2$), or a combination thereof, or an organic polymer, and in an embodiment, the dielectric layer may include $SiO_2$, $Al_2O_3$, or a combination thereof, but is not limited thereto.

Examples of the organic polymer that may be included in the dielectric layer include polydopamine (PDA), poly(methyl methacrylate) (PMMA), and polydimethylsiloxane (PDMS), but are not limited thereto.

The dielectric layer may be present in a form wherein the dielectric layer completely surrounds the metal core, that is, seals the metal core, or the dielectric layer may exist alone in a portion of the metal core to partially cover the metal core. In an embodiment, the dielectric layer may be present in a form wherein the dielectric layer completely surrounds the metal core.

The nanostructure according to an embodiment includes the quantum dots, i.e., a plurality of the quantum dots, are present entirely within the dielectric layer. That is, the quantum dots do not exist in a form in which a portion or all of the quantum dots protrude from the dielectric layer, but exist in a form in which the entire quantum dot is embedded in the dielectric layer.

In an embodiment, the nanostructure may include one or more quantum dots, and for example, a plurality of quantum dots in the dielectric layer, and each of the plurality of quantum dots may be embedded in the dielectric layer. The maximum number of quantum dots or the maximum content of quantum that may exist in the dielectric layer dots is not particularly limited, and may be adjusted to an appropriate range taking into consideration the size of the quantum dots, the thickness of the dielectric layer, the size of the nanostructure, and the like.

The quantum dots may not contain cadmium or lead, and may be, for example, quantum dots having photoluminescence characteristics that absorb light of, e.g., having, a predetermined spectrum and emit light of a longer wavelength spectrum. For example, the quantum dots may emit light of a predetermined wavelength spectrum of the visible light wavelength spectrum depending on the size thereof, composition thereof, or a combination thereof, and, for example, may be green light emitting quantum dots having a maximum emission wavelength in range of, for example, about 510 nm to about 550 nm, or red light emitting quantum dots having a maximum emission wavelength in a range of, for example, about 600 nm to about 650 nm. When the maximum emission wavelength of the quantum dots is between 510 nm and 550 nm, the maximum emission wavelength of the quantum dots may be greater than or equal to about 510 nm, greater than or equal to about 520 nm, greater than or equal to about 530 nm, or greater than or equal to about 535 nm, and less than or equal to about 545 nm, less than or equal to about 540 nm, or less than or equal to about 535 nm. In addition, when the maximum emission wavelength of the quantum dots is between 600 nm and 650 nm, the emission maximum emission wavelength of the quantum dots may be greater than or equal to about 610 nm, greater than or equal to about 620 nm, greater than or equal to about 630 nm, or greater than or equal to about 635 nm, and less than or equal to about 645 nm, less than or equal to about 640 nm, or less than or equal to about 635 nm.

In an embodiment, the quantum dots may be quantum dots containing a Group 3 element and a Group 5 element of the periodic table of elements and not containing cadmium, and may be, for example, quantum dots having a core-shell structure including a core including a Group 3 element and a Group 5 element of the periodic table of elements, and a shell disposed on the core and including a Group 2 element and a Group 6 element of the periodic table of elements.

In an embodiment, the quantum dots may have a core-shell structure including a core including a semiconductor nanocrystal including indium and phosphorus, and a shell disposed on the core and including a semiconductor nanocrystal including zinc and selenium. In an embodiment, the semiconductor nanocrystals forming the core may further include zinc, gallium, or a combination thereof, and the semiconductor nanocrystals forming the shell may further include sulfur.

For example, the shell may be a multi-layered shell, and the shell may include a first semiconductor nanocrystal shell including zinc and selenium. The shell may include a second semiconductor nanocrystal shell disposed on the first semiconductor nanocrystal shell and including zinc and sulfur.

The first semiconductor nanocrystal shell may include ZnSe (or may be made of ZnSe). In an embodiment, the first semiconductor nanocrystal shell may not include sulfur(S). For example, the first semiconductor nanocrystal shell may not include ZnSeS. In an embodiment, the first semiconductor nanocrystal shell may include ZnSe, ZnSeS, or a combination thereof. The first semiconductor nanocrystal shell (e.g., made of ZnSe) may be disposed directly on the semiconductor nanocrystal core. The first semiconductor nanocrystal shell may have a thickness of 3 monolayers (ML) or more, or 4 ML or more. The first semiconductor nanocrystal shell may have a thickness of 10 ML or less, for example, 9 ML or less, 8 ML or less, 7 ML or less, 6 ML or less, 5 ML or less, or 4 ML or less.

The second semiconductor nanocrystal shell may include zinc and sulfur. The second semiconductor nanocrystal shell may be disposed directly on the first semiconductor nanocrystal shell. The second semiconductor nanocrystal shell may have a composition that changes in a radial direction. The second semiconductor nanocrystal shell may include ZnSeS, ZnS, or a combination thereof. The second semiconductor nanocrystal shell may include two or more layers, and adjacent layers may have different compositions. The second semiconductor nanocrystal shell May include an outermost layer made of ZnS.

An average value of the size of the quantum dots may be greater than or equal to about 5.5 nm, for example, greater than or equal to about 5.6 nm, greater than or equal to about 5.7 nm, greater than or equal to about 5.8 nm, greater than or equal to about 5.9 nm, greater than or equal to about 6.0 nm, greater than or equal to about 6.1 nm, greater than or equal to about 6.2 nm, greater than or equal to about 6.3 nm, greater than or equal to about 6.4 nm, greater than or equal to about 6.5 nm, greater than or equal to about 7.0 nm, greater than or equal to about 7.5 nm, greater than or equal to about 7.6 nm, greater than or equal to about 7.7 nm, greater than or equal to about 7.8 nm, greater than or equal to about 7.9 nm, or greater than or equal to about 8.0 nm. The cadmium-free quantum dots may have a size of less than or equal to about 20 nm, for example, less than or equal to about 19 nm, less than or equal to about 18 nm, less than or equal to about 17 nm, less than or equal to about 16 nm, less than or equal to about 15 nm, less than or equal to about 14 nm, less than or equal to about 13 nm, less than or equal to about 12 nm, less than or equal to about 11 nm, less than or equal to about 10 nm, or less than or equal to about 9 nm. The size of the quantum dots may be a particle diameter. If not spherical, the size of the quantum dots may be a diameter calculated by converting a two-dimensional area confirmed by transmission electron microscopy analysis into a circle.

The size or average size of the quantum dots may be calculated from an electron microscope analysis image. In an embodiment, the size (or average size) may be a diameter or equivalent diameter (or an average value thereof) determined from electron microscopy image analysis.

The shape of the quantum dots is not particularly limited, and may include, for example, spherical shape, polyhedron, pyramidal, multipod, or cubic, nanotubes, nanowires, nanofibers, nanosheets, or a combination thereof, but is not limited thereto.

The quantum dots may include an organic ligand, an organic component derived from a solvent, or a combination thereof on the surface thereof. The organic ligand, the organic component, or the combination thereof may be bound to the quantum dot surface.

The quantum dots may have a quantum efficiency of greater than or equal to about 85%, greater than or equal to about 88%, greater than or equal to about 90%, greater than or equal to about 91%, or greater than or equal to about 92% in a solution state or a solid state. In addition, the quantum dots may have a full width at half maximum of less than or equal to about 50 nm, for example, less than or equal to about 45 nm, less than or equal to about 40 nm, or less than or equal to about 38 nm in a solution state or a solid state.

The quantum dots may be commercially available quantum dots or quantum dots produced through a quantum dot manufacturing method. A wet method as a method for producing the quantum dots may include reacting precursor materials for forming quantum dots in an appropriate solvent to obtain colloidal quantum dot particles. When the quantum dots have a core-shell structure, the method may include reacting precursor compounds forming a shell of the quantum dot on the prepared core of the quantum dot in an appropriate solvent, with the core. When forming the semiconductor nanocrystal shell, the reaction may be performed by including an appropriate organic ligand, surfactant, or a combination thereof together if desired.

The preparing of the core of the quantum dots may include reacting precursor compounds for preparing the semiconductor nanocrystal core, for example, an indium and a phosphorus compound, and optionally precursors of zinc, gallium, or a combination thereof, to prepare a semiconductor nanocrystal core in-situ, or a commercially available semiconductor nanocrystal core may be purchased and used. In an embodiment, the core may be formed by a hot injection method in which a phosphorus precursor added to a solution including an indium precursor and optionally further including a zinc precursor, gallium precursor, or a combination thereof, and optionally further including a ligand is heated to a high temperature, for example, 200° C. or higher. The preparing method of quantum dots according to an embodiment as described herein may be performed through various quantum dot preparing methods.

In each reaction step for producing the quantum dots, the contents between the precursor material included in the semiconductor nanocrystal core and the precursor material included in the semiconductor nanocrystal shell and the total amount of each of precursors may be adjusted to obtain size ranges of the core and the shell of the aforementioned quantum dot. In each step, the predetermined reaction time may be adjusted to obtain a desired composition, a desired structure, or a combination thereof in the final quantum dot.

When the quantum dot according to an embodiment includes a semiconductor nanocrystal core including indium and phosphorus, the indium precursor may include indium halide, indium nitrate, indium hydroxide, indium fluoride, indium chloride, indium bromide, indium, iodide, indium oxide, indium sulfate, indium carboxylate, indium acetate, indium acetylacetonate, or a combination thereof, but is not limited thereto.

The phosphorus precursor may include tris(trimethylsilyl) phosphine, tris(dimethylamino)phosphine, triethylphosphine, tributylphosphine, trioctylphosphine, triphenylphosphine, tricyclohexylphosphine, or a combination thereof, but is not limited thereto.

When the quantum dots according to an embodiment includes a semiconductor nanocrystal shell containing zinc and selenium, and optionally further containing sulfur, the zinc precursor may be a Zn metal powder, an alkylated Zn compound, a Zn alkoxide, a C2 to C10 Zn carboxylate, a Zn nitrate, a Zn perchlorate, a Zn sulfate, a Zn acetylacetonate, a Zn halide, a Zn cyanide, a Zn hydroxide, a Zn oxide, a Zn peroxide, or a combination thereof, but is not limited thereto. For example, the zinc precursor may include dimethyl zinc, diethyl zinc, zinc acetate, zinc acetylacetonate, zinc iodide, zinc bromide, zinc chloride, zinc fluoride, zinc carbonate, zinc cyanide, zinc nitrate, and zinc oxide, zinc peroxide, zinc perchlorate, zinc sulfate, and the like, but is not limited thereto.

The selenium precursor may include selenium-trioctylphosphine (Se-TOP), selenium-tributylphosphine (Se-TBP), selenium-triphenylphosphine (Se-TPP), or a combination thereof, but is not limited thereto.

The sulfur-containing precursor may be, for example, a sulfur powder, hexane thiol, octane thiol, decane thiol, dodecane thiol, hexadecane thiol, mercaptopropyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof, but is not limited thereto.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, $R_2POOH$, or a combination thereof, wherein R and R' are each independently a substituted or unsubstituted (e.g., C1 to C40 or C3 to C35 or C8 to C24) aliphatic hydrocarbon (e.g., alkyl group, alkenyl group, alkynyl group), or a substituted or unsubstituted (e.g., C6 to C40 or C6 to C24) aromatic hydrocarbon (e.g., aryl group).

The organic ligand may coordinate the surface of the prepared nanocrystals, and enable the nanocrystals to be well dispersed in the solution phase. Specific examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, or dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, a substituted or unsubstituted octylphosphine (e.g., trioctylphosphine (TOP)), and the like; phosphine oxide such as substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, a substituted or unsubstituted octylphosphine oxide (e.g., trioctylphosphine oxide (TOPO)), and the like; a diphenyl phosphine or an oxide compound thereof or a triphenyl phosphine or an oxide compound thereof; phosphonic acid, and the like, but are not limited thereto. A mixture of two or more different organic ligands may be used.

In an embodiment, the quantum dots may include an organic ligand on the surface, and the organic ligand may include a compound having a carboxyl group at the terminal end thereof, a compound having a hydroxy group at the terminal end thereof, or a combination thereof.

Examples of the compound having a carboxyl group at the terminal end thereof may include monovalent organic acids, and may include, for example, pentanoic acid, hexanoic acid, heptanoic acid, octanoic acid, nonanoic acid, decanoic acid, undecanoic acid, dodecanoic acid, tridecanoic acid, tetradecanoic acid, pentadecanoic acid, hexadecanoic acid, heptadecanoic acid, octadecanoic acid, nonadecanoic acid, eicosanoic acid, heneicosanoic acid, docoxanoic acid, trichosanic acid, tetracosanic acid, pentacoic acid, hexacoic acid, heptaconic acid, heptaconic acid, octacoic acid, nonaconic acid, triacontanoic acid, tetratriacontanoic acid, pentatriacontanoic acid, hexatriacontanoic acid, alpha-linolenic acid, eicosapentaenoic acid, docosahexaenoic acid, linoleic acid, gamma linolenic acid, dihomogamma linolenic acid, arachidonic acid, paulinic acid, oleic acid, elaidic acid, eicosic acid, erucic acid, nervonic acid, or a combination thereof.

Examples of the compound having a hydroxyl group at the terminal end thereof may include compounds having a hydroxyl group at one terminal end and various functional groups capable of binding to the surface of the quantum dot at the other terminal end. For example, the various functional groups may be various functional groups included in the aforementioned organic ligand, for example, a thiol group.

In an embodiment, the organic ligand bound to the surface of the quantum dots may be a combination of oleic acid and 6-mercapto-1-hexanol, but is not limited thereto.

The (organic) solvent may include a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., an alkane, an alkene, an alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine; a phosphine oxide substituted with a C6 to C22 alkyl group such as trioctylphosphine oxide; a C12 to C22 aromatic ether such as phenyl ether, benzyl ether, or a combination thereof; or a combination thereof. Types and contents of the solvent may be appropriately selected taking into consideration the types of the precursors and the organic ligand. A combination including more than one type of (organic) solvent May be used, When a nonsolvent is added to the prepared final reaction solution, the nanocrystals coordinated with the organic ligand may be separated (e.g., precipitation). The nonsolvent may be a polar solvent that is miscible with the solvent used in the reaction but cannot disperse the nanocrystals. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed by centrifugation, precipitation, chromatography, or distillation. Separated nanocrystals may be washed by adding to a washing solvent as desired. The washing solvent has no particular limit and may have a similar solubility parameter to that of the ligand and may, for example, include hexane, heptane, octane, chloroform, toluene, benzene, and the like.

The quantum dots prepared as described herein are included in the dielectric layer in the nanostructure according to an embodiment. Hereinafter, a method for manufacturing a nanostructure according to an embodiment is briefly described.

First, a nano-sized metal core is prepared, and a dielectric material within a specific thickness range is formed on the metal core. A method of forming the dielectric material on the metal core may adopt various methods, for example, a solution process of adding a precursor of the dielectric material to a solution including the metal core to additionally react the precursor and the metal core and form a dielectric material layer on the metal core. Herein, the metal core may use, e.g., include, commercially available nano particles or be synthesized in-situ by using a precursor of the metal. For example, silver nanoparticles may be synthesized in-situ from a silver-containing precursor compound as described, for example, in Nano Letter 18, 6475 (2018), the entire content of which is incorporated herein by reference, and the like. When the silver nanoparticles are prepared from the silver precursor, the precursor of the dielectric material is added to a reaction solution for the silver nanoparticles for a reaction to form a dielectric material layer on the silver nanoparticles produced therefrom. The precursor of the dielectric material may include a silica precursor, an alumina precursor, a titania precursor, and the like, for example, a silica precursor, such as, for example, TEOS (tetraethyl orthosilicate). After forming the dielectric layer with a predetermined thickness on the metal core in the aforementioned method, quantum dots prepared or purchased in advance are added to the reaction solution to be adsorbed on the dielectric layer disposed on the metal core, and then, the precursor of the dielectric material is additionally added thereto for further reaction, obtaining particles in which all of the added quantum dots are covered with the dielectric material. Subsequently, on the dielectric layer of the particles, a metal shell is formed, obtaining a nanostructure according to an embodiment. The metal shell may be formed by adding and reacting a metal precursor, which is the same as or different from the precursor for forming the metal core, to the solution including the particles having the dielectric layer. Herein, the metal core, to a dielectric layer, and the metal shell may have a predetermined size and thickness by appropriately controlling each content of the metal precursor, the precursor of the dielectric material, and the quantum dots.

Figure 4:
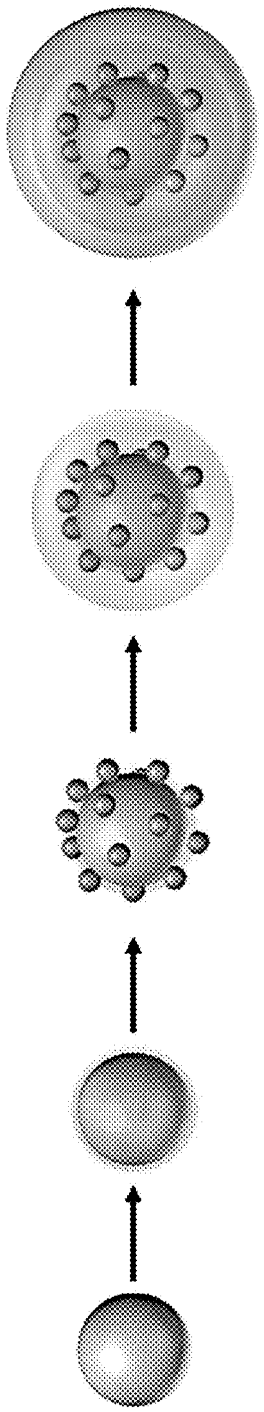
FIG. 4 is a view schematically illustrating a process of manufacturing a nanostructure according to an embodiment.

FIG. 4 schematically shows a process of manufacturing the nanostructure according to an embodiment.

As described herein, the nanostructure according to an embodiment improves a low light absorption of cadmium-free quantum dots and realizes, e.g., exhibits, excellent luminescent characteristics and may be usefully applied, e.g., used, as a light emitting material of a light emitting device and the like. For example, the nanostructure, similar to quantum dots dispersed in a polymer matrix to form a quantum dot-polymer composite, may be dispersed in the polymer matrix to form a nanostructure-polymer composite. The nanostructure-polymer composite may be prepared in the same manner as in the quantum dot-polymer composite, except for using the nanostructures instead of the quantum dots.

For example, the nanostructure-polymer composite may be prepared from a composition in which a plurality of the nanostructures according to an embodiments are dispersed in a dispersant or a dispersion solvent. For example, the composition may include a plurality of nanostructures and a dispersion solvent, and the dispersion solvent may be water, an organic solvent that is immiscible with water, or a combination thereof. The organic solvent or the dispersion solvent may be the aforementioned organic solvent that may be used to prepare quantum dots. For example, the dispersion solvent may include a substituted or unsubstituted C1 to C40 aliphatic hydrocarbon, a substituted or unsubstituted C6 to C40 aromatic hydrocarbon, or a combination thereof.

In an embodiment, the nanostructure-polymer composite may be prepared from a composition in which a plurality of nanostructures according to an embodiment mixed with a dispersant including a binder polymer, a (photo)polymerizable monomer having a carbon-carbon double bond, or a combination thereof, and the composition may optionally further include a photoinitiator. The composition may further include an organic solvent, a liquid vehicle, or a combination thereof. The composition may be a photosensitive composition.

Since the contents of the nanostructures and quantum dots in the composition are the same as those described herein, detailed descriptions thereof are omitted.

A content of the nanostructures in the composition may be appropriately adjusted taking into consideration the end use (e.g., such as a color conversion layer of an emission type color filter or a color conversion panel). In the composition (or composite), the content of the nanostructures may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on the total weight or total solids of the composition or composite. The content of the nanostructures may be less than or equal to about 70 wt %, less than or equal to about 65 wt %, less than or equal to about 60 wt %, less than or equal to about 55 wt %, less than or equal to about 50 wt %, less than or equal to about 45 wt %, less than or equal to about 40 wt %, or less than or equal to about 30 wt %, based on the total weight or total solids of the composition or composite.

The binder polymer may include a carboxyl group. In an embodiment, the binder polymer may be derived from a combination of monomers including a first monomer having a carboxyl group and a carbon-carbon double bond, a second monomer having a carbon-carbon double bond and a hydrophobic moiety and not having a carboxyl group, and optionally a third monomer having a carbon-carbon double bond and a hydrophilic moiety and not having a carboxyl group, or a copolymer thereof; a multiple aromatic ring-containing polymer (hereinafter, a cardo binder) having a backbone in which two aromatic rings in a main chain are bonded to quaternary carbon atoms that are constituent atoms of other cyclic moieties, and having a carboxyl group; or a combination thereof.

The binder polymer may be derived by polymerization of a composition that includes the first monomer, the second monomer, and optionally, the third monomer.

A content of the binder polymer in the composition may be greater than or equal to about 0.5 wt %, for example, greater than or equal to about 1 wt %, greater than or equal to about 5 wt %, greater than or equal to about 10 wt %, greater than or equal to about 15 wt %, greater than or equal to about 20 wt %, greater than or equal to about 30 wt %, greater than or equal to about 40 wt %, or greater than or equal to about 50 wt %, based on the total weight or total solid content of the composition or composite, but is not limited thereto. The content of the dispersant (or binder polymer) may be less than or equal to about 60 wt %, less than or equal to about 50 wt %, less than or equal to about 40 wt %, less than or equal to about 35 wt %, less than or equal to about 33 wt %, less than or equal to about 30 wt %, less than or equal to about 20 wt %, or less than or equal to about 10 wt %, based on the total weight or total solids of the composition or composite. The content of the dispersant (or binder polymer) may be about 0.5 wt % to about 55 wt %, based on the total weight or total solids of the composition or composite.

The polymerizable (e.g., photopolymerizable) monomer having the carbon-carbon double bond may include a (e.g., photopolymerizable) (meth)acryl-based monomer. The monomer may be a precursor for the insulating polymer.

The content of the monomer may be greater than or equal to about 0.5 wt %, for example, greater than or equal to about 1 wt %, greater than or equal to about 2 wt %, greater than or equal to about 5 wt %, greater than or equal to about 10 wt %, greater than or equal to about 15 wt %, greater than or equal to about 20 wt %, greater than or equal to about 25 wt %, or greater than or equal to about 30 wt %, based on the total weight or total solids of the composition or composite. The content of the photopolymerizable monomer may be less than or equal to about 60 wt %, less than or equal to about 50 wt %, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt %, based on the total weight or total solids of the composition or composite.

The (photo)initiator included in the composition may be used for (photo)polymerization of the aforementioned monomer. The initiator is a compound accelerating a radical reaction (e.g., radical polymerization of monomer) by producing radical chemical species under a mild condition (e.g., by heat or light). The initiator may be a thermal initiator or a photoinitiator. The initiator is not particularly limited and may be appropriately selected.

In the composition, a content of the initiator may be appropriately adjusted considering types and contents of the polymerizable monomers. In an embodiment, the content of the initiator may be greater than or equal to about 0.01 wt %, for example, greater than or equal to about 1 wt %, greater than or equal to about 5 wt %, or greater than or equal to about 10 wt %, and for example, less than or equal to about 9 wt %, less than or equal to about 8 wt %, less than or equal to about 7 wt %, less than or equal to about 6 wt %, or less than or equal to about 5 wt %, based on the total weight of the composition (or the total weight of the solid content), but is not limited thereto.

The composition may further include a (multi- or mono-functional) thiol compound having a, e.g., at least one, thiol group at the terminal end thereof, metal oxide particulates, or a combination thereof.

The metal oxide particulates may include $TiO_2$, $SiO_2$, $BaTiO_3$, $Ba_2TiO_4$, ZnO, or a combination thereof. In an embodiment, the metal oxide particulates may be $TiO_2$.

In the composition, a content of the metal oxide particulates may be greater than or equal to about 1 wt %, greater than or equal to about 5 wt %, greater than or equal to about 10 wt %, greater than or equal to about 15 wt %, greater than or equal to about 20 wt %, greater than or equal to about 25 wt %, greater than or equal to about 30 wt %, or greater than or equal to about 35 wt %; less than or equal to about 60 wt %, less than or equal to about 50 wt %, less than or equal to about 40 wt %, less than or equal to about 30 wt %, less than or equal to about 25 wt %, less than or equal to about 20 wt %, less than or equal to about 15 wt %, less than or equal to about 10 wt %, or less than or equal to about 5 wt %; or a combination thereof, based on the total weight (or the solid weight) of the composition. The metal oxide particulates may be non-luminescent. Herein, the term metal oxide may include an oxide of a metal or a semi-metal.

A diameter of the metal oxide particulates is not particularly limited, and may be appropriately selected. The diameter of the metal oxide particulates may be greater than or equal to about 100 nm, for example, greater than or equal to about 150 nm, or greater than or equal to about 200 nm and less than or equal to about 1,000 nm, less than or equal to about 800 nm, less than or equal to about 500 nm, less than or equal to about 400 nm, or less than or equal to about 300 nm.

The thiol compound included in the composition may be represented by Chemical Formula 1:

Chemical Formula 1

$$[R^1 \,]_{k1}\text{—}L_1\text{—}[\,Y_1\text{—}(SH)_m]_{k2}.$$

In Chemical Formula 1, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group (—NRR', wherein R and R' are each independently hydrogen or a C1 to C30 linear or branched alkyl group and are not simultaneously hydrogen); an isocyanate group; a halogen; —ROR' (wherein R is a substituted or unsubstituted C1 to C20 alkylene group and R' is hydrogen or a C1 to C20 linear or branched alkyl group); an acyl halide group (—RC(═O)X, wherein R is a substituted or unsubstituted alkylene group and X is a halogen); —C(═O)OR' (wherein R' is hydrogen or a C1 to C20 linear or branched alkyl group); —CN; —C(═O)ORR', or —C(═O)ONRR' (wherein R and R' are each independently hydrogen or a C1 to C20 linear or branched alkyl group), $L_1$ is a carbon atom, a substituted or unsubstituted C1 to C30 alkylene group, a substituted or unsubstituted C1 to C30 alkylene group wherein a, e.g., at least one, methylene (—$CH_2$—) is replaced by sulfonyl (—$SO_2$—), carbonyl (CO), ether (—O—), sulfide (—S—), sulfoxide (—SO—), ester (—C(═O)O—), amide (—C(═O)NR—) (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene moiety, $Y_1$ is a single bond; a substituted or unsubstituted C1 to C30 alkylene group; a substituted or unsubstituted C2 to C30 alkenylene group; or a C1 to C30 alkylene group or a C2 to C30 alkenylene group wherein a, e.g., at least one, methylene (—$CH_2$—) is replaced by sulfonyl (—$S(═O)_2$—), carbonyl (—C(═O)—), ether (—O—), sulfide (—S—), sulfoxide (—S(═O)—), ester (—C(═O)O—), amide (—C(═O)NR—) (wherein R is hydrogen or a C1 to C10 linear or branched alkyl group), imine (—NR—) (wherein R is hydrogen or a C1 to C10 linear or branched alkyl group), or a combination thereof, m is an integer of 1 or more, k1 is 0 or an integer of 1 or more, k2 is an integer of 1 or more, and a sum of m and k2 is an integer of 3 or more, provided that m does not exceed the valence of $Y_1$, and a sum of k1 and k2 does not exceed the valence of $L_1$.

The (multi) thiol compound may be a dithiol compound, a trithiol compound, a tetrathiol compound, or a combination thereof. For example, the thiol compound may be glycoldi-3-mercaptopropionate, glycol dimercapto acetate, trimethylolpropane tris(3-mercaptopropionate), pentaerythritol tetrakis(3-mercaptopropionate), pentaerythritol tetrakis (2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

A content of the (multi) thiol compound may be less than or equal to about 60 wt %, less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %, based on the total weight of the composition (or a total weight of solids). The content of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, greater than or equal to about 15 wt %, greater than or equal to about 20 wt %, or greater than or equal to about 25 wt %, based on the total weight of the composition (or a total weight of solids).

The composition may further include an organic solvent (or liquid vehicle, hereinafter referred to as a solvent). The type of useable solvent is not particularly limited. Non-limiting examples of the solvent or liquid vehicle may be ethyl 3-ethoxy propionate; an ethylene glycol such as ethylene glycol, diethylene glycol, polyethylene glycol, and the like; a glycol ether such as ethylene glycol monomethyl ether, ethylene glycol monoethyl ether, diethylene glycol monomethyl ether, ethylene glycol diethyl ether, diethylene glycol dimethyl ether, and the like; a glycol ether acetate such as ethylene glycol acetate, ethylene glycol monoethyl ether acetate, diethylene glycol monoethyl ether acetate, diethylene glycol monobutyl ether acetate, and the like; a propylene glycol such as propylene glycol, and the like; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, dipropylene glycol diethylether, and the like; a propylene glycol ether acetate such as propylene glycol monomethyl ether acetate, dipropylene glycol monoethyl ether acetate, and the like; an amide such as N-methylpyrrolidone, dimethyl formamide, dimethyl acetamide, and the like; a ketone such as dimethylsulfoxide; methylethylketone (MEK), methyl isobutyl ketone (MIBK), cyclohexanone, and the like; a petroleum such as solvent naphtha, and the like; an ester such as ethyl acetate, butyl acetate, ethyl lactate, and the like; an ether such as tetrahydrofuran, diethyl ether, dipropyl ether, dibutyl ether, and the like; chloroform, a C1 to C40 aliphatic hydrocarbon (e.g., alkane, alkene, or alkyne), a halogen- (e.g., chlorine-) substituted C1 to C40 aliphatic hydrocarbon (e.g., dichloroethane, trichloromethane, and the like), a C6 to C40 aromatic hydrocarbon (e.g., toluene, xylene, and the like), or a halogen- (e.g., chlorine-) substituted C6 to C40 aromatic hydrocarbon; or a combination thereof, but are not limited thereto.

The types and contents of the organic solvent may be appropriately determined by considering the aforementioned main components (i.e., the nanostructures, the dispersant, the polymerizable monomer, the initiator, and if used, the thiol compound,) and types and contents of additives which is described herein. The composition may include a solvent in a residual amount except for a desired content of the (non-volatile) solid.

The composition (e.g., inkjet composition) may have a viscosity at 25° C. of greater than or equal to about 4 centipoise (cPs), greater than or equal to about 5 cPs, greater than or equal to about 5.5 cPs, greater than or equal to about 6.0 cPs, or greater than or equal to about 7.0 cPs. The composition may have a viscosity at 25° C. of less than or equal to about 12 cPs, less than or equal to about 10 cPs, or less than or equal to about 9 cPs.

When used for inkjet, the composition may be discharged to a substrate at room temperature, and may be heated, for example, to form a nanostructure-polymer composite film or a pattern thereof. The ink composition, while having the aforementioned viscosity, may have a surface tension at about 23° C. of greater than or equal to about 21 millinewtons per meter (mN/m), greater than or equal to about 22 mN/m, greater than or equal to about 23 mN/m, greater than or equal to about 24 mN/m, greater than or equal to about 25 mN/m, greater than or equal to about 26 mN/m, greater than or equal to about 27 mN/m, greater than or equal to about 28 mN/m, greater than or equal to about 29 mN/m, greater than or equal to about 30 mN/m, or greater than or equal to about 31 mN/m and less than or equal to about 40 mN/m, less than or equal to about 39 mN/m, less than or equal to about 38 mN/m, less than or equal to about 36 mN/m, less than or equal to about 35 mN/m, less than or equal to about 34 mN/m, less than or equal to about 33 mN/m, or less than or equal to about 32 mN/m. The ink composition may have a surface tension of less than or equal to about 31 mN/m, less than or equal to about 30 mN/m, less than or equal to about 29 mN/m, or less than or equal to about 28 mN/m.

In an embodiment, the composition may further include, for example, an additive included in the composition for photoresist or the ink composition. The additive may include a light diffusing agent, a leveling agent, a coupling agent, and the like. For specific details, for example, reference may be made to the contents described in US-2017-0052444-A1.

The composition may be prepared by a method that includes preparing a nanostructure dispersion including the aforementioned nanostructures, the aforementioned dispersant, a solvent, or a combination thereof; and mixing an initiator; a polymerizable monomer (e.g., an acrylic or methacrylic monomer); and optionally a thiol compound, metal oxide particulates, and optionally the aforementioned additive in the nanostructure dispersion. Each of the aforementioned components may be mixed sequentially or simultaneously, and the order is not particularly limited.

The composition may be used to provide the composite of nanostructures according to an embodiment, for example, a polymer composite of nanostructures. The composition may provide, for example, a nanostructure-polymer composite by radical polymerization. The composition for preparing a composite of nanostructures according to an embodiment may be a photoresist composition including nanostructures applicable to, e.g., usable in, photolithography. The composition according to an embodiment may be an ink composition capable of providing a pattern by a printing method (e.g., a droplet discharging method such as inkjet printing).

Accordingly, the nanostructure-polymer composite according to an embodiment includes a matrix that is a polymer, and the aforementioned nanostructures dispersed in the matrix, and it is configured to emit light corresponding to the emission wavelength of the quantum dots included in the nanostructure.

Based on the total weight of the nanostructure-polymer composite, the content of the plurality of nanostructures may be greater than or equal to about 10%, greater than or equal to about 20%, greater than or equal to about 30%, greater than or equal to about 40%, greater than or equal to about 50%, or greater than or equal to about 60%, for example, greater than or equal to about 10% and less than or equal to about 60%, greater than or equal to about 15% and less than or equal to about 60%, greater than or equal to about 20% and less than or equal to about 60%, greater than or equal to about 25% and less than or equal to about 60%, greater than or equal to about 30% and less than or equal to about 60%, greater than or equal to about 30% and less than or equal to about 55%, greater than or equal to about 35% and less than or equal to about 55%, greater than or equal to about 40% and less than or equal to about 55%, greater than or equal to about 45% and less than or equal to about 60%, greater than or equal to about 45% and less than or equal to about 55%, or about 50%, but is not limited thereto.

Based on the total weight of the nanostructure-polymer composite, the content of the matrix may be greater than or equal to about 10%, greater than or equal to about 20%, greater than or equal to about 30%, greater than or equal to about 40%, greater than or equal to about 50%, greater than or equal to about 60%, or greater than or equal to about 70% and less than or equal to about 90%, less than or equal to about 80%, less than or equal to about 70%, less than or equal to about 60%, less than or equal to about 50%, or less than or equal to about 40%, for example, greater than or equal to about 10% and less than or equal to about 90%, greater than or equal to about 20% and less than or equal to about 85%, greater than or equal to about 25% and less than or equal to about 80%; greater than or equal to about 30% and less than or equal to about 75%, greater than or equal to about 30% and less than or equal to about 70%, greater than or equal to about 30% and less than or equal to about 65%, greater than or equal to about 30% and less than or equal to about 60%, greater than or equal to about 30% and less than or equal to about 55%, greater than or equal to about 35% and less than or equal to about 55%, greater than or equal to about 35% and less than or equal to about 50%, greater than or equal to about 30% and less than or equal to about 45%, greater than or equal to about 30% and less than or equal to about 40%, or greater than or equal to about 35% and less than or equal to about 45%, but is not limited thereto.

The polymer matrix may include a crosslinked polymer, a linear polymer, or a combination thereof. The crosslinked polymer may include a thiolene resin, a crosslinked poly (meth)acrylate, a crosslinked polyurethane, a crosslinked epoxy resin, a crosslinked vinyl polymer, a crosslinked silicone resin, or a combination thereof. The linear polymer may include a carboxylic acid-containing repeating unit.

The matrix may include the aforementioned polymer binder, a polymerization product of a polymerizable monomer including a, e.g., at least one, carbon-carbon double bond, for example 2 or more, 3 or more, 4 or more, or 5 or more, such as an insulating polymer, and optionally a polymerization product between the polymerizable monomer and thiol compounds having a, e.g., at least one, for example, two or more thiol groups at the terminal end thereof.

The nanostructure-polymer composite may be in the form of a film, for example, in the form of a patterned film. The patterning may be performed using a photolithographic method or the like, and the composition for preparing the nanostructure-polymer composite may include a photocurable material as the binder polymer or a photopolymerizable monomer. The nanostructure-polymer composite may be printed in a patterned form through an inkjet printing process or the like, as is described in more detail herein.

The display panel according to an embodiment may include the nanostructure-polymer composite. The display panel may include a color conversion layer including a plurality of regions including a color conversion region, and the nanostructure-polymer composite according to the aforementioned embodiment may be disposed in the color conversion region in the color conversion layer. In an embodiment, the color conversion layer may further include a partition wall defining the plurality of regions.

In an embodiment, the display panel may further include a light emitting panel including a light emitting source, and the color conversion layer may convert an emission spectrum of light emitted from the light emitting panel. For example, the color conversion layer may absorb blue light emitted from the light emitting source and convert the blue light emitted from the light emitting source into green light or red light.

In an embodiment, the color conversion layer may be in a form of a patterned film.

In an embodiment, the color conversion region of the color conversion layer may include a, e.g., at least one, first region (hereinafter also referred to as a first partition) configured to convert the light irradiated by the excitation light into light of a first emission spectrum and emit it, and the first region may include the nanostructure-polymer composite according to an embodiment. The color conversion layer may be in the form of a nanostructure-polymer composite patterned film.

The color conversion region may include a (e.g., one or more) second region (hereinafter also referred to as a second partition) configured to emit a second light different from the first light (e.g., by irradiation of excitation light), and the second region may include a nanostructure-polymer composite including quantum dots having an emission peak wavelength different from that of the nanostructure according to an embodiment.

An emission spectrum of the first light may be a green light emission spectrum having an emission peak wavelength of about 500 nm to about 550 nm (e.g., about 510 nm to about 540 nm), and an emission spectrum of the second light may be a red light emission spectrum having an emission peak wavelength of about 610 nm to about 660 nm (e.g., about 620 nm to about 650 nm).

The color conversion layer may further include a (e.g., at least one) third region (hereinafter also referred to as a third partition) that emits or passes a third light (e.g., blue light) different from the first light and the second light. The third light may include excitation light. The third light may include blue light having an emission peak wavelength in a range of about 430 nm to about 470 nm.

The color conversion layer (or the patterned film of the nanostructure-polymer composite) may be prepared using a photoresist composition. The method using a photoresist composition may include forming a film of a composition for preparing a nanostructure-polymer composite according to an embodiment on a substrate (S1); prebaking the film according to selection (S2); exposing a selected region of the film to light (e.g., having a wavelength of less than or equal to about 400 nm) (S3); and developing the exposed film with an alkali developing solution to obtain a pattern of a nanostructure-polymer composite (S4).

Figure 5:
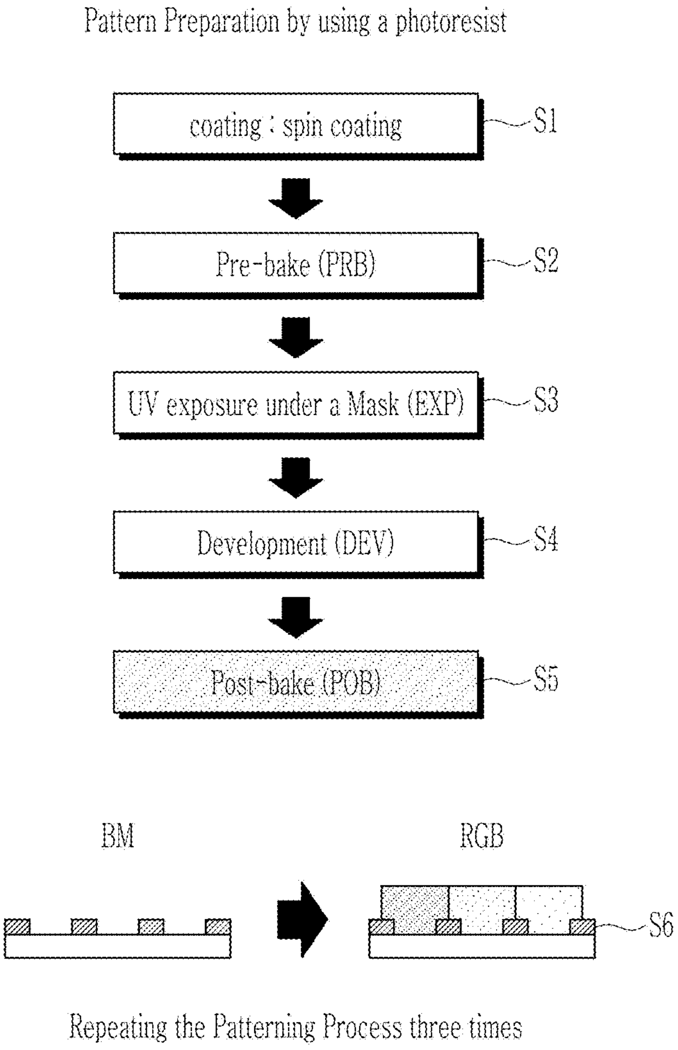
FIG. 5 is a schematic view illustrating a pattern forming process for manufacturing a composite of nanostructures according to an embodiment.

Referring to FIG. 5, the aforementioned composition is applied to a predetermined thickness on a substrate using an appropriate method such as spin coating or slit coating to form a film. The formed film may be optionally subjected to a pre-baking (PRB). The pre-baking may be performed by selecting an appropriate condition from conditions of a temperature, time, an atmosphere, and the like.

The formed (or optionally prebaked) film is exposed to light having a predetermined wavelength under a photoresist mask having a predetermined pattern. A wavelength and intensity of the light may be selected considering types and contents of the photoinitiator, types and contents of the quantum dots included in the nanostructure, and the like.

The exposed film is treated with an alkali developing solution (e.g., dipping or spraying) to dissolve an unexposed region and obtain a desired pattern. The obtained pattern may be, optionally, post-baked (POB) (S5) to improve crack resistance and solvent resistance of the pattern, for example, at a temperature of about 150° C. to about 230° C. for a predetermined time (e.g., greater than or equal to about 10 minutes or greater than or equal to about 20 minutes).

When the color conversion layer or the patterned film of the nanostructure-polymer composite has a plurality of repeating partitions (that is, color conversion regions), each repeating partition may be formed by preparing a plurality of compositions including nanostructures according to an embodiment including quantum dots (e.g., red light-emitting quantum dots, green quantum dots, or optionally, blue quantum dots) having desired luminescent properties (emission peak wavelength and the like) and repeating the aforementioned pattern-forming process as many times as desired (e.g., 2 times or more, or 3 times or more) for each composition, resultantly obtaining a nanostructure-polymer composite having a desired pattern (S6). For example, the nanostructure-polymer composite may have a pattern of at least two repeating color partitions (e.g., RGB color partitions). The nanostructure-polymer composite pattern may be used as a photoluminescence type color filter in a display device.

Figure 6:
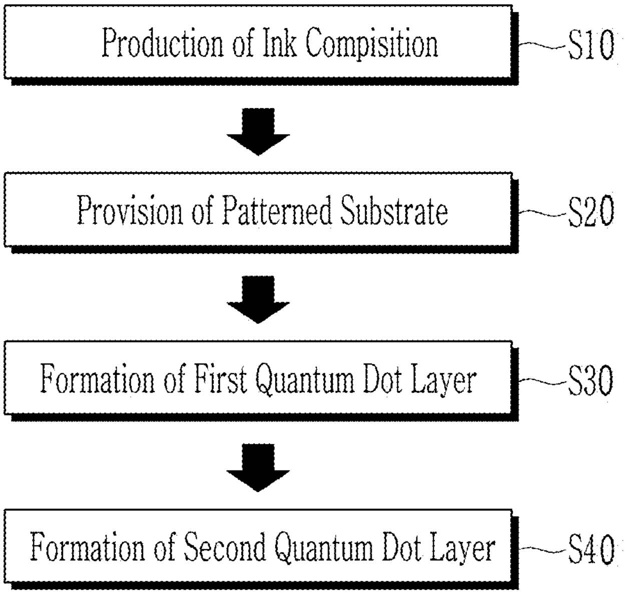
FIG. 6 is a schematic view showing a pattern forming process using an ink composition as a form of a composite of nanostructures according to an embodiment.

The color conversion layer or the patterned film of the nanostructure-polymer composite may be produced using an ink composition configured to form a pattern in an inkjet manner. Referring to FIG. 6, such a method may include preparing an ink composition according to an embodiment (S10), providing a substrate (e.g., with pixel areas patterned by electrodes and optionally banks, etc.) (S20), depositing an ink composition on the substrate (or the pixel region) to form, for example, a first color conversion region (S30); and depositing an ink composition on the substrate (or the pixel region) to form, for example, a second color conversion region (S40). The forming of the first color conversion region and the forming of the second color conversion region may be simultaneously or sequentially carried out.

The depositing of the ink composition may be performed using an appropriate liquid crystal discharger, for example an inkjet or nozzle printing system having an ink storage and a, e.g., at least one, print head. The deposited ink composition may provide a first or second quantum dot layer through the solvent removal and polymerization by the heating. The method may provide a highly precise nanostructure-polymer composite film or patterned film for a short time by the simple method.

The aforementioned nanostructure or nanostructure-polymer composite (pattern) may be included in an electronic device. Such electronic devices may include a display device, a light emitting diode (LED), an organic light emitting diode (OLED), a quantum dot LED, a sensor, a solar cell, an imaging sensor, a biosensor, a photodetector, or a liquid crystal display device, but not limited to thereto. The aforementioned nanostructure or nanostructure-polymer composite (pattern) may be included in an electronic apparatus. The electronic apparatus may include, but is not limited to, a portable terminal device, a monitor, a notebook computer, a television, an electric sign board, a camera, a VR (virtual reality) or AR (augmented reality) device, a car, and the like.

Hereinafter, the display panel and the color conversion panel will be described in more detail with reference to the drawings.

Figure 7:
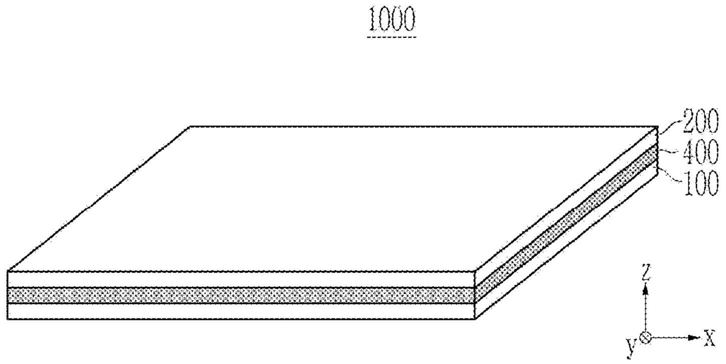
FIG. 7 is a perspective view illustrating an example of a display panel according to an embodiment.
Figure 8:
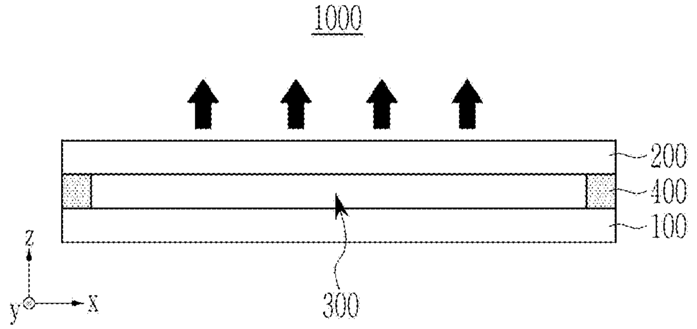
FIG. 8 is a cross-sectional view of the display panel of FIG. 7.

Referring to FIGS. 7 and 8, the display panel 1000 according to an embodiment includes a light emitting panel 100, a color conversion panel 200, and a light transmitting layer 300 between the light emitting panel 100 and the color conversion panel 200, and a binder 400 for bonding the light emitting panel 100 and the color conversion panel 200.

The light emitting panel 100 and the color conversion panel 200 may face each other with the light transmitting layer 300 therebetween, and the color conversion panel 200 may be disposed in a direction in which light is emitted from the light emitting panel 100. The binder 400 may be disposed along the edges of the light emitting panel 100 and the color conversion panel 200, and may be, for example, a sealing material.

In FIGS. 7 and 8, although the light transmitting layer 300 is present between the light emitting panel 100 and the color conversion panel 200, and the binder 400 is disposed along the edges of the light emitting panel 100 and the color conversion panel 200, the light transmitting layer 300 and the binder 400 may be omitted and may not be included. That is, the light emitting panel 100 and the color conversion panel 200 may be directly coupled without interposing the light transmitting layer 300.

Figure 9:
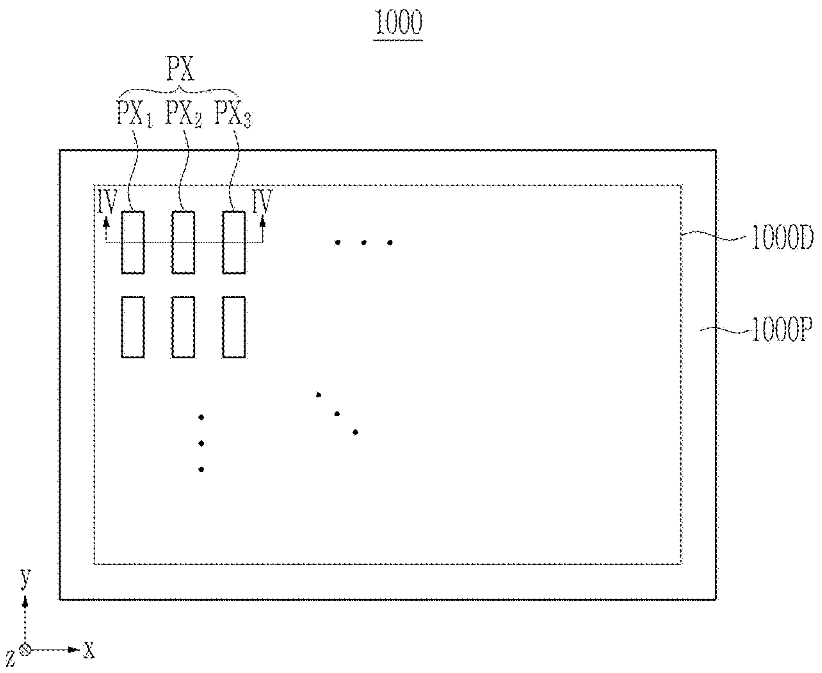
FIG. 9 is a plan view illustrating an example of a pixel arrangement of the display panel of FIG. 7.

Referring to FIG. 9, a display panel 1000 according to an embodiment includes a display area 1000D for displaying an image and a non-display area 1000P disposed around the display area 1000D and in which the binder 400 is disposed.

The display area 1000D may include a plurality of pixels PX arranged along a row (e.g., x direction), a column (e.g., y direction), or a combination thereof, and each pixel PX may include a plurality of subpixels $PX_1$, $PX_2$, and $PX_3$ displaying different colors. Herein, as an example, a configuration in which three subpixels $PX_1$, $PX_2$, and $PX_3$ constitute one pixel is illustrated, but the configuration is not limited thereto. An additional subpixel such as a white subpixel may be further included, and one or more subpixel displaying the same color may be included. The plurality of pixels PX may be arranged in, for example, a Bayer matrix, a PenTile matrix, a diamond matrix, or a combination thereof, but is not limited thereto.

Each of the subpixels $PX_1$, $PX_2$, and $PX_3$ may display a color of three primary colors or a combination of three primary colors, for example, red, green, blue, or a combination thereof. For example, the first subpixel $PX_1$ may display red, the second subpixel $PX_2$ may display green, and the third subpixel $PX_3$ may display blue.

In the drawing, an example in which all subpixels have the same size is illustrated, but the present disclosure is not limited thereto. A subpixel, e.g., at least one of the subpixels, may be larger or smaller than the other subpixels. In the drawing, an example in which all subpixels have the same shape is illustrated, but the present disclosure is not limited thereto. A subpixel, e.g., at least one of the subpixels, may have a different shape from other subpixels.

Figure 10:
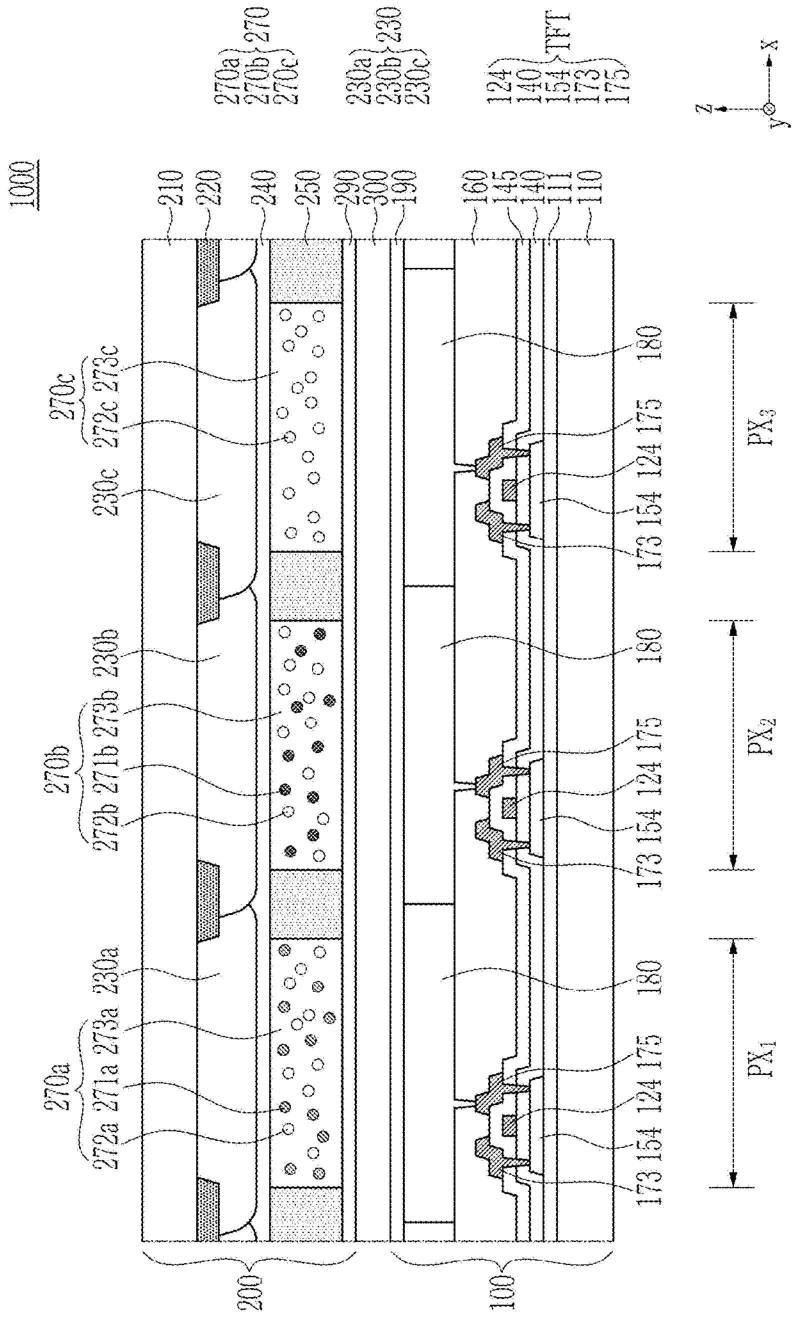
FIG. 10 is a cross-sectional view of the display panel of FIG. 9 taken along line IV-IV.

Referring to FIG. 10, the light emitting panel 100 and the color conversion panel 200 is sequentially described.

The light emitting panel 100 may include a light emitting element that emits light in a predetermined wavelength region and a circuit element for switching the light emitting element, driving the light emitting element, or a combination thereof. The light emitting panel 100 may include a lower substrate 110, a buffer layer 111, a thin film transistor (TFT), a light emitting element 180, and an encapsulation layer 190.

The lower substrate 110 may be a glass substrate or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto.

The buffer layer 111 may include an organic material, an inorganic material, or an organic-inorganic material. The buffer layer 111 may include, for example, an oxide, a nitride, or an oxynitride, and may include, for example, silicon oxide, silicon nitride, silicon oxynitride, or a combination thereof, but is not limited thereto. The buffer layer 111 may be one layer or two or more layers, and may cover the whole surface of the lower substrate 110. The buffer layer 111 may be omitted.

The thin film transistor TFT may be a three-terminal element for switching the light emitting element 180, driving the light emitting element 180, or a combination thereof, which will be described herein, and one or two or more may be included for each subpixel. The thin film transistor TFT may include a gate electrode 124, a semiconductor layer 154 overlapped with the gate electrode 124, a gate insulating layer 140 between the gate electrode 124 and the semiconductor layer 154, and a source electrode 173 and a drain electrode 175 electrically connected to the semiconductor layer 154. In the drawings, a coplanar top gate structure is shown as an example, but the structure is not limited thereto and may have various structures.

The gate electrode 124 is electrically connected to a gate line (not shown), and may include, for example, a low-resistance metal such as aluminum (Al), molybdenum (Mo), copper (Cu), titanium (Ti), silver (Ag), gold (Au), an alloy thereof, or a combination thereof, but is not limited thereto.

The semiconductor layer 154 may be an inorganic semiconductor such as amorphous silicon, polycrystalline silicon, or oxide semiconductor; an organic semiconductor; an organic-inorganic semiconductor; or a combination thereof. For example, the semiconductor layer 154 may include an oxide semiconductor including indium (In), zinc (Zn), tin (Sn), gallium (Ga), or a combination thereof, and the oxide semiconductor may include, for example, indium-gallium-zinc oxide, zinc-tin oxide, or a combination thereof, but the oxide semiconductor is not limited thereto. The semiconductor layer 154 may include a channel region and doped regions disposed on both sides of the channel region and electrically connected to the source electrode 173 and the drain electrode 175, respectively.

The gate insulating layer 140 may include an organic material, an inorganic material, or an organic-inorganic material, and may include, for example, an oxide, a nitride, or an oxynitride, and may include, for example, silicon oxide, silicon nitride, silicon oxynitride, or a combination thereof, but is not limited thereto. In the drawing, an example in which the gate insulating layer 140 is formed on the entire surface of the lower substrate 110 is illustrated, but the present disclosure is not limited thereto and may be selectively formed between the gate electrode 124 and the semiconductor 154. The gate insulating layer 140 may be formed of one or two or more layers.

The source electrode 173 and the drain electrode 175 may include, for example, a low-resistance metal such as aluminum (Al), molybdenum (Mo), copper (Cu), titanium (Ti), silver (Ag), gold (Au), an alloy thereof, or a combination thereof, but are not limited thereto. The source electrode 173 and the drain electrode 175 may be electrically connected to the doped regions of the semiconductor layer 154, respectively. The source electrode 173 is electrically connected to a data line (not shown), and the drain electrode 175 is electrically connected to a light emitting element 180 to be described herein.

An interlayer insulating layer 145 is additionally formed between the gate electrode 124 and the source/drain electrodes 173 and 175. The interlayer insulating layer 145 may include an organic material, an inorganic material, or an organic-inorganic material, for example, oxide, nitride, or oxynitride, for example, silicon oxide, silicon nitride, silicon oxynitride, or a combination thereof, but is not limited thereto. The interlayer insulating layer 145 may be formed of one or two or more layers.

A protective layer 160 is formed on the thin film transistor TFT. The protective layer 160 may be, for example, a passivation layer. The protective layer 160 may include an organic material, an inorganic material, or an organic-inorganic material, for example, polyacrylic, polyimide, polyamide, polyamideimide, or a combination thereof, but is not limited thereto. The protective layer 160 may be formed of one or two or more layers.

The light emitting element 180 may be disposed for each subpixel $PX_1$, $PX_2$, and $PX_3$, and the light emitting element 180 disposed in each subpixel $PX_1$, $PX_2$, and $PX_3$ may be independently driven. The light emitting element 180 may be, for example, a light emitting diode, and may include a pair of electrodes and a light emitting layer between the pair of electrodes. The light emitting layer may include a light emitting body capable of emitting light in a predetermined wavelength region, and for example, may include a light emitting body that emits light in a first emission spectrum belonging to a visible wavelength spectrum. The light emitting body may include an organic light emitting body, an inorganic light emitting body, an organic-inorganic light emitting body, or a combination thereof, and may be one type or two or more types.

The light emitting element 180 may be, for example, an organic light emitting diode, an inorganic light emitting diode, or a combination thereof. The inorganic light emitting diode may be, for example, a quantum dot light emitting diode, a perovskite light emitting diode, a micro light emitting diode, an inorganic nano light emitting diode, or a combination thereof, but is not limited thereto.

Figure 11:
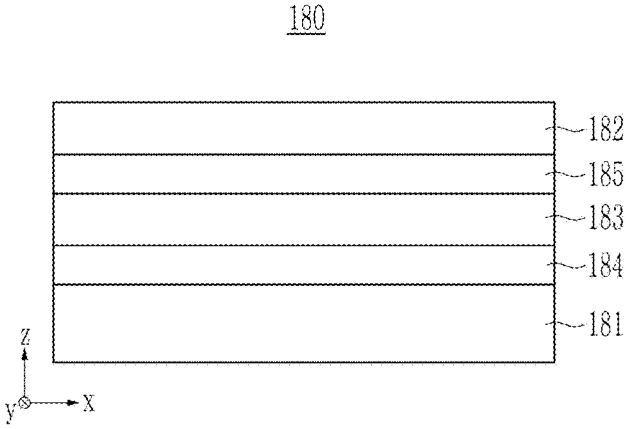
FIGS. 11 to 13 are cross-sectional views each showing examples of light emitting elements.
Figure 12:
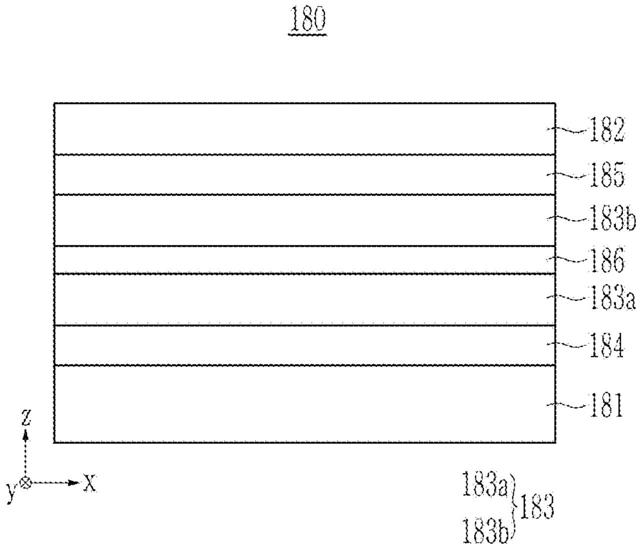
Figure 13:
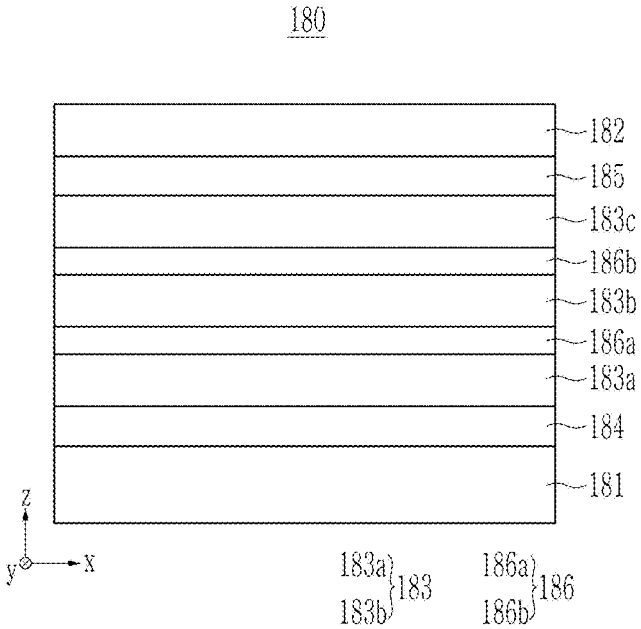

FIGS. 11 to 13 are cross-sectional views showing examples of light emitting elements, respectively.

Referring to FIG. 11, the light emitting element 180 includes a first electrode 181 and a second electrode 182 facing each other; a light emitting layer 183 between the first electrode 181 and the second electrode 182; and optionally auxiliary layers 184 and 185 between the first electrode 181 and the light emitting layer 183 and between the second electrode 182 and the light emitting layer 183.

The first electrode 181 and the second electrode 182 may be disposed to face each other along a thickness direction (for example, z direction), and one of the first electrode 181 and the second electrode 182 may be an anode and the other may be a cathode. The first electrode 181 may be a light transmitting electrode, a transflective electrode, or a reflecting electrode, and the second electrode 182 may be a light transmitting electrode or a transflective electrode. The light transmitting electrode or transflective electrode may be, for example, made of a thin single layer or multiple layers of metal thin film including conductive oxides such as indium tin oxide (ITO), indium zinc oxide (IZO), zinc oxide (ZnO), tin oxide (SnO), aluminum tin oxide (AlTO), and fluorine-doped tin oxide (FTO) or silver (Ag), copper (Cu), aluminum (Al), magnesium (Mg), magnesium-silver (Mg—Ag), magnesium-aluminum (Mg—Al), or a combination thereof. The reflecting electrode may include a metal, a metal nitride, or a combination thereof, for example, silver (Ag), copper (Cu), aluminum (Al), gold (Au), titanium (Ti), chromium (Cr), nickel (Ni), an alloy thereof, a nitride thereof (e.g., TiN), or a combination thereof, but is not limited thereto.

The light emitting layer 183 may include a light emitting body capable of emitting light of a specific wavelength. The specific wavelength may belong to a relatively short wavelength region of the visible light wavelength spectrum, and may be, for example, a blue emission wavelength (and a green emission wavelength if selected). A maximum emission wavelength of blue light emission may belong to a wavelength region of greater than or equal to about 400 nm and less than 500 nm, and may belong to a wavelength region of about 410 nm to about 490 nm or about 420 nm to about 480 nm within the disclosed range. The light emitting body may be one or two or more.

For example, the light emitting layer 183 may include a host material and a dopant material.

For example, the light emitting layer 183 may include a phosphorescent material, a fluorescent material, or a combination thereof.

For example, the light emitting body may include an organic light emitting body, and the organic light emitting body may be a low molecular weight compound, a polymer, or a combination thereof. When the light emitting body includes an organic light emitting body, the light emitting element 180 may be an organic light emitting diode.

For example, the light emitting body may include an inorganic light emitting body, and the inorganic light emitting body may be an inorganic semiconductor, quantum dot, perovskite, or a combination thereof. When the light emitting body includes an inorganic light emitting body, the light emitting element 180 may be a quantum dot light emitting diode, a perovskite light emitting diode, a micro light emitting diode, a nano light emitting diode, or the like, but is not limited thereto.

The auxiliary layers 184 and 185 may be disposed between the first electrode 181 and the light emitting layer 183 and between the second electrode 182 and the light emitting layer 183, respectively, and may be a charge auxiliary layer to control injection, mobility, or a combination thereof of charges, respectively. Each of the auxiliary layers 184 and 185 may be one or two or more layers, and may be, for example, a hole injection layer, a hole transport layer, an electron blocking layer, an electron injection layer, an electron transport layer, a hole blocking layer, or a combination thereof. An auxiliary layer, e.g., at least one of the auxiliary layers 184 and 185, may be omitted.

The light emitting elements 180 disposed in each of the subpixels $PX_1$, $PX_2$, and $PX_3$ may be the same or different from each other. The light emitting elements 180 disposed in each of the subpixels $PX_1$, $PX_2$, and $PX_3$ may emit light of the same emission spectrum, for example, each may emit light of a blue emission spectrum, for example, light of a blue emission spectrum having a maximum emission wavelength in a wavelength region of greater than or equal to about 400 nm and less than about 500 nm, about 410 nm to about 490 nm, or about 420 nm to about 480 nm. The light emitting elements 180 disposed in each of the subpixels $PX_1$, $PX_2$, and $PX_3$ may or May not be separated by a pixel defining layer (not shown).

Referring to FIG. 12, the light emitting element 180 may be a light emitting element having a tandem structure, and includes a first electrode 181 and a second electrode 182 facing each other; a first light emitting layer 183*a* and a second light emitting layer 183*b* between the first electrode 181 and the second electrode 182; a charge generation layer 186 between the first light emitting layer 183*a* and the second light emitting layer 183*b*, and optionally auxiliary layers 184 and 185 between the first electrode 181 and the first light emitting layer 183*a* and between the second electrode 182 and the second light emitting layer 183*b*.

The first electrode 181, the second electrode 182, and the auxiliary layers 184 and 185 are as described herein.

The first light emitting layer 183*a* and the second light emitting layer 183*b* may emit light having the same or different emission spectrum, and, for example, each may emit light having a blue emission spectrum. Detailed descriptions are the same as the light emitting layer 183 described herein.

The charge generation layer 186 may inject electric charges into the first light emitting layer 183*a*, the second light emitting layer 183*b*, or a combination thereof, and may control a charge balance between the first light emitting layer 183*a* and the second light emitting layer 183*b*. The charge generation layer 186 may include, for example, an n-type layer and a p-type layer, and may include, for example, an electron transport material; a hole transport material including an n-type dopant, a p-type dopant, or a combination thereof; or a combination thereof. The charge generation layer 186 may be one layer or two or more layers.

Referring to FIG. 13, the light emitting element 180 may be a light emitting element having a tandem structure, and includes a first electrode 181 and a second electrode 182 facing each other; a first light emitting layer 183*a*, a second light emitting layer 183*b*, and a third light emitting layer 183*c* between the first electrode 181 and the second electrode 182; a first charge generation layer 186*a* between the first light emitting layer 183*a* and the second light emitting layer 183*b*; a second charge generation layer 186*b* between the second light emitting layer 183*b* and the third light emitting layer 183*c*; and optionally, auxiliary layers 184 and 185 between the first electrode 181 and the first light emitting layer 183*a* and between the second electrode 182 and the third light emitting layer 183*c*.

The first electrode 181, the second electrode 182, and the auxiliary layers 184 and 185 are as described herein.

The first light emitting layer 183*a*, the second light emitting layer 183*b*, and the third light emitting layer 183*c* may emit light having the same or different emission spectrum, and, for example, each may emit light having a blue emission spectrum. Detailed descriptions are the same as the light emitting layer 183 described herein.

The first charge generation layer 186*a* may inject electric charges into the first light emitting layer 183*a*, the second light emitting layer 183*b*, or a combination thereof, and may control charge balances between the first light emitting layer 183*a* and the second light emitting layer 183*b*. The second charge generation layer 186*b* may inject electric charges into the second light emitting layer 183*b*, the third light emitting layer 183*c*, or a combination thereof, and may control charge balances between the second light emitting layer 183*b* and the third light emitting layer 183*c*. Each of the first and second charge generation layers 186*a* and 186*b* may be one layer or two or more layers.

Referring to FIGS. 7 to 10, the encapsulation layer 190 covers the light emitting element 180 and may include a glass plate, a metal thin film, an organic film, an inorganic film, an organic-inorganic film, or a combination thereof. The organic film may include, for example, an acrylic resin, a methacrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, an oxynitride, or a combination thereof, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 190 may be one or two or more layers.

The color conversion panel 200 converts the light of the specific spectrum supplied from the light emitting panel 100 into light of a first emission spectrum or a second emission spectrum different from the first emission spectrum and emits the light of the first or second emission spectrum to an observer (not shown). The color conversion panel 200 may include an upper substrate 210, a light blocking pattern 220, a color filter layer 230, a planarization layer 240, a partition wall 250, a color conversion layer 270, and an encapsulation layer 290.

The upper substrate 210 may be a glass substrate or a polymer substrate. The polymer substrate may include, for example, polyimide, polyamide, polyamideimide, polyethylene terephthalate, polyethylene naphthalene, polymethyl methacrylate, polycarbonate, a copolymer thereof, or a combination thereof, but is not limited thereto.

The color conversion layer 270 faces the light emitting element 180 of the light emitting panel 100. The color conversion layer 270 may include a, e.g., at least one, color conversion region for converting an emission spectrum of light supplied from the light emitting panel 100 into other emission spectrum, and the color conversion region may, for example, convert light in the emission spectrum supplied from the light emitting panel 100 into light in the emission spectrum of the color displayed by each of the subpixels $PX_1$, $PX_2$, and $PX_3$.

The color conversion region may include a color converting body that converts the emission spectrum of light supplied from the light emitting panel 100 into another emission spectrum, and the display panel according to an embodiment may include the nanostructure-polymer composite according to an embodiment in the color conversion region.

The color conversion region may convert the light supplied from the light emitting panel 100 into light having a wavelength spectrum of a color displayed by each of the subpixels $PX_1$, $PX_2$, and $PX_3$ and then may emit it, and the nanostructure-polymer composite included in each color conversion region may be different from each other.

Referring to FIG. 10, at least a portion of the color conversion layer 270 may include the nanostructure-polymer composite including quantum dots. For example, the color conversion layer 270 may include a first color conversion region 270*a* included in the first subpixel $PX_1$ and including first nanostructures 271*a* (and optionally, secondary quantum dots 272*a* of the first color conversion region 270*a*), for example, in a first matrix 273*a*; a second color conversion region 270*b* included in the second subpixel $PX_2$ and including second nanostructures 271*b* (and optionally, secondary quantum dots 272*b* of the second color conversion region 270*b*), for example, in a second matrix 273*b*; and a light transmitting region 270*c*, for example, optionally including third quantum dots 272*c* in a third matrix 273*c*.

The first nanostructures 271*a* included in the first color conversion region 270*a* may convert light emitted from the light emitting panel 100 into light of the first emission spectrum that is the same as the wavelength spectrum of the color displayed by the first subpixel $PX_1$. The first emission spectrum may be different from the emission spectrum of the light emitted from the light emitting panel 100 and may have a longer wavelength than the emission spectrum.

The second nanostructures 271*b* included in the second color conversion region 270*b* may convert the light emitted from the light emitting panel 100 into light having the same second emission spectrum as the wavelength spectrum of the color displayed by the second subpixel $PX_2$. The second emission spectrum may be different from the first emission spectrum and may have a longer wavelength than the first emission spectrum.

For example, when the light emitting element 180 of the light emitting panel 100 emits light of a blue emission spectrum, and the first subpixel $PX_1$, the second subpixel $PX_2$, and the third subpixel $PX_3$ respectively displays red, green, and blue, the first nanostructures 271*a* included in the first color conversion region 270*a* may convert the light of the blue emission spectrum into light of the red emission spectrum, and the second nanostructures 271*b* included in the second color conversion region 270*b* may convert the light of the blue emission spectrum into light of the green emission spectrum.

The blue displayed in the third subpixel $PX_3$ may be displayed by the light of the blue emission spectrum emitted from the light emitting element 180 of the light emitting panel 100 and displayed through the light transmitting region 270*c* without a separate color conversion body (quantum dots or nanostructures) in the third subpixel $PX_3$. However, the third subpixel $PX_3$ may further include the color conversion body such as quantum dots or nanostructures including the same configured to emit light of the blue emission spectrum.

The partition wall 250 may define each region of the color conversion layer 270 and be disposed between adjacent regions. For example, the partition wall 250 may respectively define the aforementioned first and second color conversion regions 270*a* and 270*b* and light transmitting region 270*c* and be disposed between the adjacent first and second color conversion regions 270*a* and 270*b*, between the second color conversion region 270*b* and the light transmitting region 270*c*, which are neighboring each other, between the first color conversion region 270*a* and the light transmitting region 270*c*, which are neighboring each other, or a combination thereof. The partition wall 250 may provide a space to which a composition for the color conversion layer 270 is supplied and simultaneously, prevent each composition for the first color conversion region 270*a*, the second color conversion region 270*b*, and the light transmitting region 270*c* from overflowing into each neighboring first color conversion region 270*a*, second color conversion region 270*b*, and light transmitting region 270*c* during the process of forming the first color conversion region 270*a*, the second color conversion region 270*b*, and the light transmitting region 270*c*.

The partition wall 250 may directly contact the first color conversion region 270*a*, the second color conversion region 270*b*, and the light transmitting region 270*c* without separate layers between the partition wall 250 and the first color conversion region 270*a*, between the partition wall 250 and the second color conversion region 270*b*, and between the partition wall 250 and the light transmitting region 270*c*.

The color filter layer 230 may more precisely filter light emitted from the color conversion layer 270 and enhance color purity of the light emitted toward the upper substrate 210. For example, the first color filter 230*a* overlapped with the first color conversion region 270*a* may block light not converted by but transmitting the first nanostructures 271*a* of the first color conversion region 270*a* and for example, enhance color purity of light of the red emission spectrum. For example, the second color filter 230*b* overlapped with the second color conversion region 270*b* may block light not converted by but transmitting the second nanostructures 271*b* of the second color conversion region 270*b* and for example, enhance color purity of light of the green emission spectrum. For example, the third color filter 230*c* overlapped with the second color conversion region 270*c* may block light other than light of the blue emission spectrum and for example, enhance color purity of light of the blue emission spectrum. For example, at least some of the first, second, and third color filter 230*a*, 230*b*, and 230*c* may be omitted, for example, the third color filter 230*c* overlapped with the light transmitting region 270*c* may be omitted.

The light blocking pattern 220 may partition each subpixel $PX_1$, $PX_2$, and $PX_3$ and be disposed between the neighboring subpixels $PX_1$, $PX_2$, and $PX_3$. The light blocking pattern 220 may be, for example, a black matrix. The light blocking pattern 220 may be overlapped with the edges of the neighboring color filters 230*a*, 230*b*, and 230*c*.

The planarization layer 240 may be disposed between the color filter layer 230 and the color conversion layer 270, and may reduce or eliminate a step difference caused by the color filter layer 230. The planarization layer 240 may include an organic material, an inorganic material, an organic-inorganic material, or a combination thereof. The planarization layer 240 may include, for example, an oxide, a nitride, or an oxynitride, for example, silicon oxide, silicon nitride, silicon oxynitride, or a combination thereof, but is not limited thereto. The planarization layer 240 may be one layer or two or more layers, and may cover the entire surface of the upper substrate 210.

The encapsulation layer 290 may cover the color conversion layer 270 and the partition wall 250, and may include a glass plate, a metal thin film, an organic film, an inorganic film, an organic-inorganic film, or a combination thereof. The organic film may include, for example, an acrylic resin, a methacrylic resin, polyisoprene, a vinyl resin, an epoxy resin, a urethane resin, a cellulose resin, a perylene resin, or a combination thereof, but is not limited thereto. The inorganic film may include, for example, an oxide, a nitride, an oxynitride, or a combination thereof, for example silicon oxide, silicon nitride, silicon oxynitride, aluminum oxide, aluminum nitride, aluminum oxynitride, zirconium oxide, zirconium nitride, zirconium oxynitride, titanium oxide, titanium nitride, titanium oxynitride, hafnium oxide, hafnium nitride, hafnium oxynitride, tantalum oxide, tantalum nitride, tantalum oxynitride, lithium fluoride, or a combination thereof, but is not limited thereto. The organic-inorganic film may include, for example, polyorganosiloxane, but is not limited thereto. The encapsulation layer 290 may be one or two or more layers.

The light transmitting layer 300 may be disposed between the light emitting panel 100 and the color conversion panel 200. The light transmitting layer 300 may be, for example, a filling material. The light transmitting layer 300 may include an organic material, an inorganic material, an organic-inorganic material, or a combination thereof, and may include, for example, an epoxy resin, a silicone compound, a polyorganosiloxane, or a combination thereof.

Figure 14:
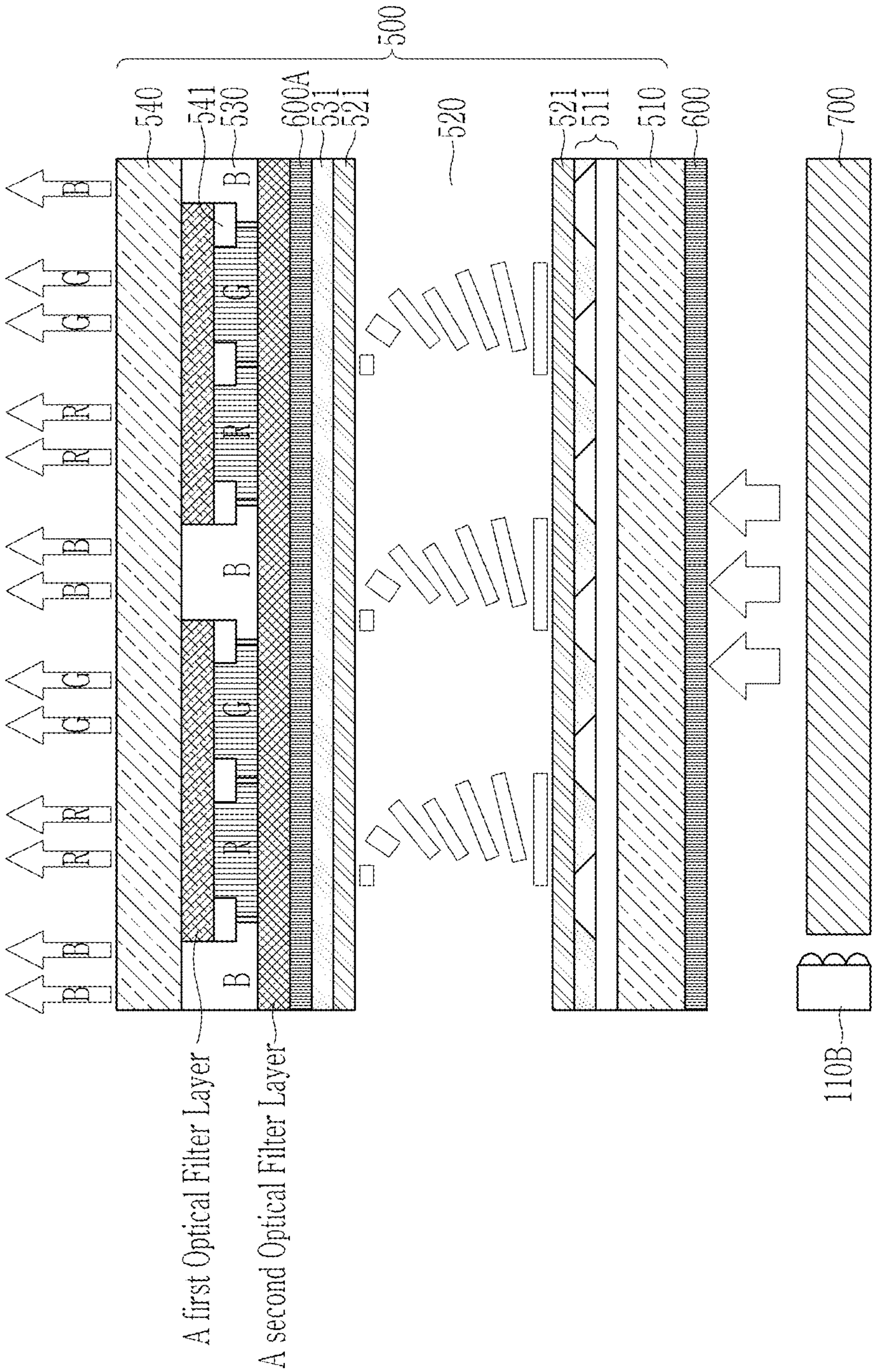
FIG. 14 is a schematic cross-sectional view of a display panel according to an embodiment.

FIG. 14 is a schematic cross-sectional view of a liquid crystal display device 2000 according to a non-limiting embodiment.

Referring to FIG. 14, the liquid crystal display device 2000 of an embodiment includes a liquid crystal panel 500, a polarizing plate 600 disposed under the liquid crystal panel 500, and a backlight unit disposed under the polarizing plate 600. The backlight unit includes a light source 110B and a light guide plate 700. The backlight unit may be in the form of direct sunlight without a light guide plate.

The liquid crystal panel 500 may include a lower substrate 510, an upper substrate 540, and a liquid crystal layer 520 between the lower substrate 510 and the upper substrate 540, and may include a color conversion layer 530 disposed on the upper or lower surface of the upper substrate 540. The color conversion layer 530 may include the nanostructure-polymer composite according to an exemplary embodiment.

The lower substrate 510 that is also referred to as an array substrate may be a transparent insulating material substrate. The substrate is the same as described herein. A wire plate 511 is provided on an upper surface of the lower substrate 510. The wire plate 511 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 520 may be disposed on the wire plate 511. The liquid crystal layer 520 may include an alignment layer 521 on and under the layer 520 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizing plate 600 is provided under the lower substrate 510. Materials and structures of the polarizing plate 600 are not particularly limited. A backlight unit (e.g., emitting blue light) may be disposed under the polarizing plate 600. An upper optical element or an upper polarizing plate 600A may be provided between the liquid crystal layer 520 and the transparent substrate 540, but is not limited thereto. For example, the upper polarizing plate 600A may be disposed between the liquid crystal layer 520 and the color conversion layer 530. The polarizing plate 600A may be any suitable polarizer that may be used in a liquid crystal display device. The polarizing plate 600A may be TAC (triacetyl cellulose) having a thickness of less than or equal to about 200 μm, but is not limited thereto. In an embodiment, the upper optical element may be a coating that controls a refractive index without a polarization function.

The light source 110B included in the backlight unit may emit blue light or white light. The light source may include, but is not limited to, a blue LED, a white LED, a blue OLED, a white OLED, or a combination thereof.

In an embodiment, the backlight unit may be an edge-type lighting. For example, the backlight unit may include a reflector (not shown), a light guide panel (not shown) provided on the reflector and providing a planar light source with the liquid crystal panel 500, a, e.g., at least one, optical sheet (not shown) on the light guide panel, for example, a diffusion plate, a prism sheet, and the like, or a combination thereof, but is not limited thereto. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally a, e.g., at least one, optical sheet. Details (e.g., each component of a light emitting diode, a fluorescent lamp, light guide panel, various optical sheets, and a reflector) of such a backlight unit are not particularly limited.

A black matrix 541 is provided under the transparent substrate 540 and the black matrix 541 has openings and hides a gate line, a data line, and a thin film transistor of the wire plate on the lower substrate. For example, the black matrix 541 may have a lattice shape. The color conversion layer 530 is provided in the openings of the black matrix 541 and has a nanostructure-polymer composite pattern including a first region R configured to emit first light (e.g., red light), a second region G configured to emit second light (e.g., green light), and a third region B configured to emit/transmit, for example blue light. If desired, the color conversion layer 230 may further include a, e.g., at least one, fourth region. The fourth region may include quantum dots or a nanostructure-polymer composite including the same emitting light of a different color (e.g., cyan, magenta, and yellow) from the light emitted from the first to third regions.

The regions forming the pattern in the color conversion layer 530 may be repeated corresponding to the pixel area formed in the lower substrate. A transparent common electrode 531 may be provided on the photoluminescent color conversion layer 530.

The third region B configured to transmit/emit blue light may be a transparent color filter that does not change the emission spectrum of the light source. The blue light emitted from the backlight unit may be incident in a polarized state through the polarizing plate 600 and the liquid crystal layer 520 and may be emitted as is. If desired, the third region may include quantum dots emitting blue light or a nanostructure including the same.

If desired, the display device or the light emitting device according to an embodiment may further include an excitation light blocking layer or a first optical filter layer (hereinafter, referred to as a first optical filter layer). The first optical filter layer may be disposed between the lower surfaces of the first region R and the second region G and the substrate (e.g., the upper substrate 540) or on the upper surface of the substrate. The first optical filter layer may be a sheet having an opening in a portion corresponding to a pixel region (third region) displaying blue, and may be formed in portions corresponding to the first and second regions. Two or more first optical filter layers may be spaced apart from each other at positions overlapped with the first and second regions, and optionally, the third region. When the light source includes a green light emitting element, a green light blocking layer may be disposed on the third region.

The first optical filter layer may block light having, for example, a predetermined wavelength region in the visible light region and may transmit light in the other wavelength regions, and for example, the first optical filter layer may block blue light (or green light) and may transmit light except the blue light (or green light). The first optical filter layer may transmit, for example, green light, red light, and/or yellow light which is a mixed color thereof. The first optical filter layer may transmit blue light and block green light, and may be disposed on the blue light emitting pixel.

The display device may further include a second optical filter layer (e.g., red/green light or yellow light recycling layer) that is disposed between the light emitting layer and the liquid crystal layer (e.g., between the light emitting layer and the upper polarizer), transmits at least a portion of the third light (excitation light), and reflects at least a portion of the first light, the second light, or a combination thereof. The first light may be red light, the second light may be green light, and the third light may be blue light. The second optical filter layer may transmit only the third light (B) in a blue light wavelength region having a wavelength region of less than or equal to about 500 nm and light in a wavelength region of greater than about 500 nm, which is green light (G), yellow light, red light (R), or the like, may be not passed through the second optical filter layer and reflected. The reflected green light and red light may pass through the first and second sections and to be emitted to the outside of the liquid crystal display device 2000.

The second optical filter layer or the first optical filter layer may be formed as an integrated layer having a relatively planar surface.

The first optical filter layer may include a polymer thin film including a dye, a pigment, or a combination thereof absorbing light in a wavelength which is to be blocked. The second optical filter layer and the first optical filter layer may include a single layer having a low refractive index, and may be, for example, a transparent thin film having a refractive index of less than or equal to about 1.4, less than or equal to about 1.3, or less than or equal to about 1.2. The second optical filter layer or the first optical filter layer having a low refractive index may be, for example, a porous silicon oxide, a porous organic material, a porous organic/inorganic composite, or a combination thereof.

The first optical filter layer or the second optical filter layer may include a plurality of layers having different refractive indexes. The plurality of layers having different refractive indexes may be formed by laminating two layers having different refractive indexes refractive index. For example, the first/second optical filter layer may be formed by alternately laminating a material having a high refractive index and a material having a low refractive index.

Hereinafter, the embodiments are illustrated in more detail with reference to examples. However, they are exemplary examples of the present disclosure, and the present disclosure is not limited thereto.

Examples

Analysis Methods

1. Ultraviolet-Visible (UV-Vis) Spectroscopy

Ultraviolet (UV) spectroscopy is performed using an Agilent Cary5000 spectrometer to obtain the UV-Visible absorption spectrum.

2. Transmission Electron Microscopy Analysis

Transmission Electron Microscopy (TEM) analysis is performed using a UT F30 Tecnai electron microscope.

Synthesis Example 1: Preparation of InP/ZnSe/ZnS Quantum Dot

According to a method described in U.S. Pat. No. 10,619,096, a quantum dot is prepared to include a semiconductor nanocrystal core including indium and phosphorus, and a multi-layer shell including a first shell disposed on the core and including a semiconductor nanocrystal comprising zinc and selenium and a second shell disposed on the first shell and including a semiconductor nanocrystal comprising zinc and sulfur, which has an oleate ligand on the surface and an average size of about 6.5 nanometers (nm) and is represented by InP/ZnSe/ZnS.

All or a portion of the oleate ligand on the quantum dot surface is substituted with a 6-mercapto-1-hexanol (MHOH) ligand by adding an ethanol solution in which the 6-mercapto-1-hexanol is dissolved to a solution in which the quantum dot is dispersed and then, stirring the mixture. After completing the ligand substitution, the quantum dot is centrifuged, several times washed with ethanol, and dispersed again in ethanol, obtaining dispersion of the InP/ZnSe/ZnS quantum dot.

Example 1: Preparation of InP/ZnSe/ZnS Nanostructure Including Quantum Dots

Figure 15:
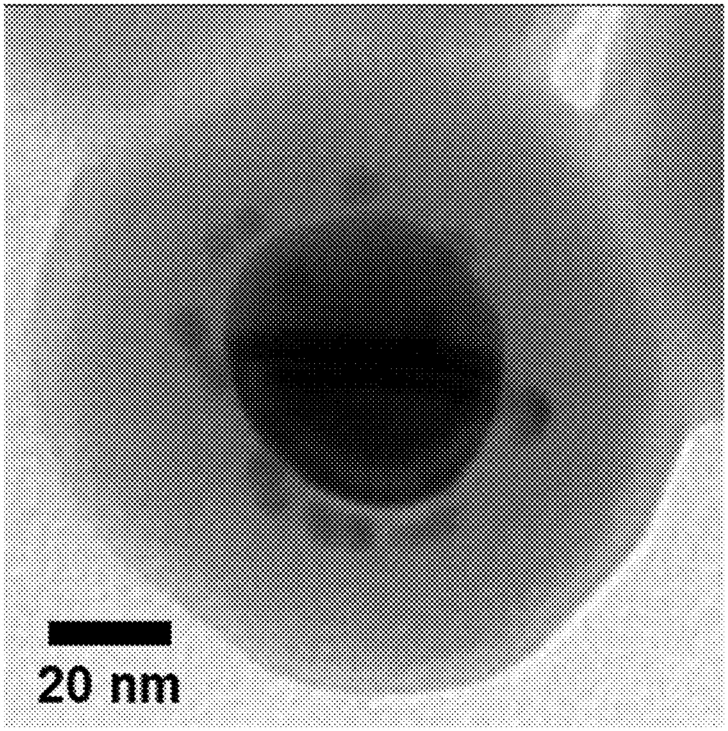
FIG. 15 is a transmission electron microscope (TEM) photograph of particles in which a dielectric layer (silica layer) including a plurality of quantum dots is formed on silver nanoparticles, which is produced as an intermediate for forming a nanostructure according to Example 1.

As described in Nano Letter 18, 6475 (2018), a silver (Ag) nanoparticle with a size of about 45 nm is obtained by reducing silver nitrate ($AgNO_3$) in micelles of cetrimonium chloride, that is, cetyltrimethylammonium chloride ($C_{19}H_{42}ClN$: CTAC) and benzyldimethylhexadecyl ammonium chloride (BDAC). The formed silver nanoparticle is centrifuged, washed with purified water and ethanol, and then, dispersed again in ethanol. Subsequently, a precursor of silica, TEOS (tetraethyl orthosilicate), is added to the solution in which the silver nanoparticle is dispersed, forming a silica shell with a thickness of about 4 nm on the silver nanoparticle through a hydrolysis condensation polymerization reaction. Then, the dispersion of the InP/ZnSe/ZnS quantum dot surface-modified with the 6-mercapto-1-hexanol in Synthesis Example 1 is added to the aforementioned solution, and the quantum dot may be absorbed on the silica shell. The TEOS solution is further added to the aforementioned solution for a reaction, and all of the quantum dots absorbed to the silica shell may form a dielectric layer by the further formed silica. The nanoparticles having the dielectric layer formed in this way are centrifuged, several times with ethanol, and dispersed again in the ethanol. The nanoparticles dispersed in the ethanol are taken a photograph of by TEM, and the result is shown in FIG. 15.

Figure 16:
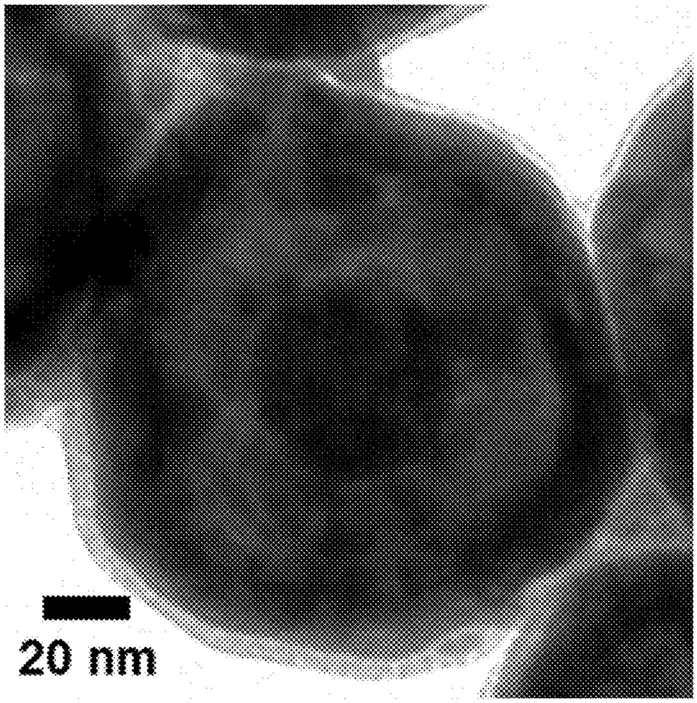
FIG. 16 is a transmission electron microscope (TEM) photograph of the nanostructure prepared in Example 1.

Subsequently, $AgNO_3$ is further added to the solution to reduce silver, thereby obtaining a nanostructure that a silver (Ag) shell with a thickness of about 20 nm is coated on the nanoparticle having the silica dielectric layer. The nanostructure is centrifuged, several times washed with ethanol and water, and dispersed again in ethanol, thereby obtaining a nanostructure including the silver nanocore, the silica layer disposed thereon and including the quantum dots, and the silver shell surrounding the silica layer. The nanostructure is taken a photograph of by TEM, and the image is shown in FIG. 16.

Comparative Example 1: Preparation of Nanostructures not Including Metal Shell A nanostructure including a silver nanocore and a silica dielectric layer including quantum dots but not a metal shell is prepared in the same manner as in Example 1 by not forming the additional silver nano shell after forming the silica shell including the InP/ZnSe/ZnS quantum dots of Synthesis Example 1 on the silver nanocore.

Evaluation 1: Effect of Thicknesses of Dielectric Layer and Metal Shell on Photoluminescence Enhancement The nanostructure prepared in Example 1 is simulated with respect to an electric field enhancement effect according to thickness changes of the silica layer and thickness changes of the silver shell and a photoluminescence enhancement effect of the quantum dots, and the results are respectively shown in FIGS. 17 and 18.

Figure 17:
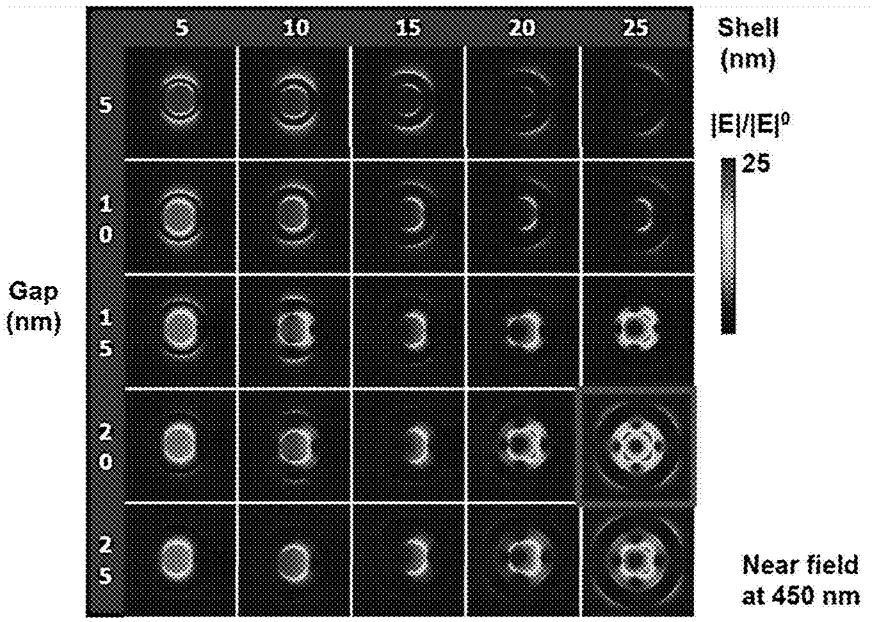
FIG. 17 is a view showing a result of simulating an electric field enhancement effect while changing thickness (gap thickness) of a dielectric layer and thickness of a metal shell of a nanostructure according to an embodiment.

When the thickness of the silica layer is increased from 5 nm to 25 nm by 5 nm, and the thickness of the silver shell is increased from 5 nm to 25 nm by 5 nm, each nanostructure is simulated with respect to an electric field enhancement degree ($|E|/|E_0|$) by FEM (Finite Element Method) or BEM (Boundary Element Method), and the results are shown in FIG. 17. Referring to FIG. 17, when the nanostructure has a shell thickness of 25 nm and a dielectric layer thickness of 20 nm, the highest electric field enhancement degree is obtained.

Figure 18:
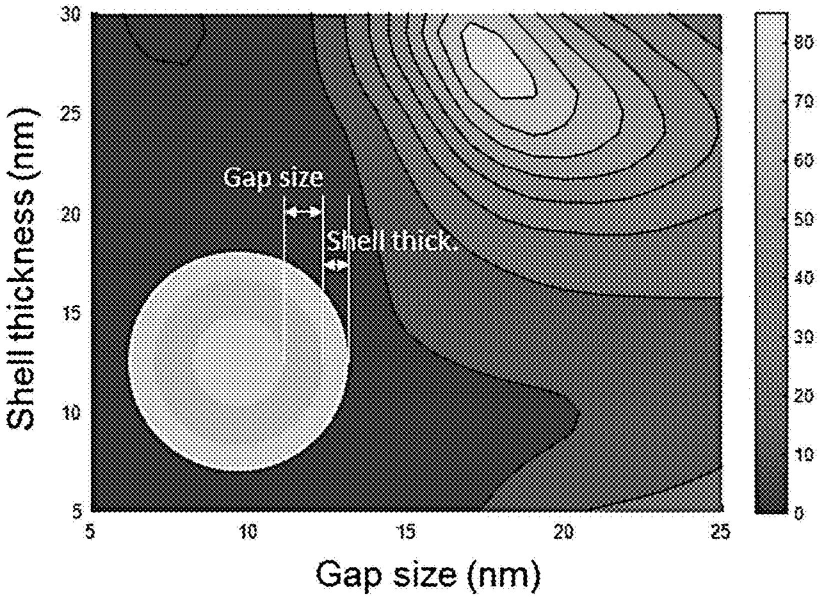
FIG. 18 is a view showing simulation results of predicting photoluminescence enhancement factors of quantum dots in a nanostructure of an embodiment according to changes in thickness (gap thickness) of the dielectric layer and thickness of the metal shell of the nanostructure.

In addition, based on the result of FIG. 17, when the quantum dots in the dielectric layer of each nanostructure absorb light of 450 nm and emit light of 522 nm by increasing the thickness of the silica layer from 5 nm to 15 nm by 5 nm but from 15 nm to 25 nm by 1 nm and in addition, the thickness of the silver shell from 5 nm to 20 nm by 5 nm but from 20 nm to 30 nm by 1 nm, a photoluminescence (PL) enhancement factor ($=(|E|^2/|E_0|^2)\times QE$)) is predicted through FDTD (Finite Difference Time Domain) simulation, and the result is shown in FIG. 18. Referring to FIG. 18, when the silica layer thickness is about 17 nm, and the silver shell thickness is about 29 nm, the quantum dots in the silica layer exhibit the highest (about 80%) photoluminescence enhancement factor.

Figure 19:
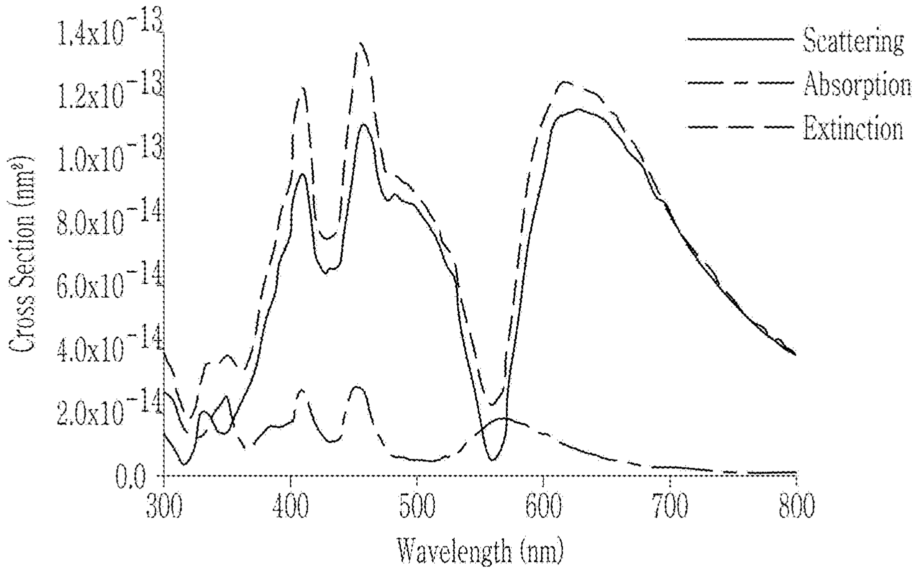
FIG. 19 is a graph of cross section (square nanometers ($nm^2$)) versus wavelength (nm) showing an emission curve, an absorption curve, and a scattering curve per cross-sectional area according to a wavelength of a nanostructure according to an embodiment.

This result is supported by graphs showing a light emitting curve, an absorption curve, and a scattering curve per cross-sectional area of the nanostructure according to a wavelength of FIG. 19. In other words, the nanostructure according to Example 1 has characteristics of a cross-sectional shape and a cross-sectional structure according to a size of the nanocore, a thickness of the dielectric layer, and a thickness of the silver nanoshell, and referring to the graphs of FIG. 19, the corresponding nanostructure forms a high scattering cross-section in a region of 400 nm to 500 nm. This result indicates that a significantly high absorption of light of the wavelength range, which can contribute to emission of the quantum dots in the dielectric layer of the corresponding nanostructure is obtained due to structural characteristics, which means that the light absorption contributing to the emission of the quantum dots is increased.

Evaluation 2: Effect of Distance from Core in Dielectric Layer on Photoluminescence Enhancement When the nanostructure according to Example 1 and the nanostructure having no metal shell according to Comparative Example 1 are irradiated by light in an x direction and a y direction at each position where the quantum dots in the silica layer are respectively 2 nm, 4 nm, 6 nm, 8 nm, 10 nm, 12 nm, and 14 nm apart from each silver nanoparticle surface, photoluminescence enhancement factors of the quantum dots are calculated through FDTD simulation, and the results are shown in a graph of FIG. 20.

Figure 20:
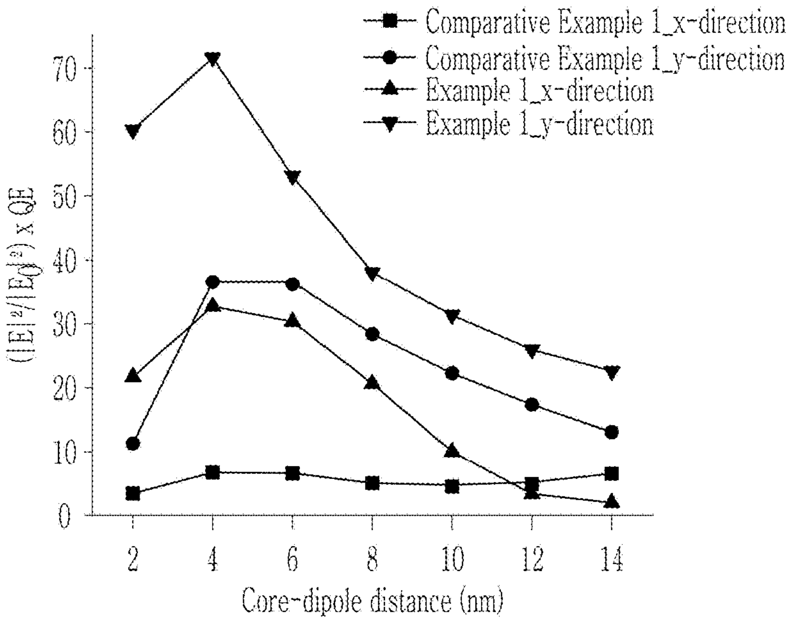
FIG. 20 is a graph of $|E|^2/|E_0|^2)\times QE$, wherein $|E_0|$ is the electric field intensity of the incident light, $|E|$ is the electric field intensity enhanced by the nanostructure, and QE is the quantum efficiency) versus core-dipole distance (nm) showing simulation results of the photoluminescence enhancement factor of the quantum dot at each position while irradiating light in the x-direction and the y-direction, respectively, when the distances from the surface of the silver nanoparticles to the positions of the quantum dots in the silica layer for each of the nanostructures prepared in Example 1 and Comparative Example 1 are 2 nm, 4 nm, 6 nm, 8 nm, 10 nm, 12 nm, and 14 nm, respectively.

Referring to FIG. 20, in both cases of irradiated light in the x direction and the y direction, the nanostructures of Example 1 and Comparative Example 1 exhibit the highest photoluminescence enhancement factor at the position where the nanostructures are 4 nm apart from the silver nanocore surface. However, compared with the nanostructure having no metal shell according to Comparative Example 1, the nanostructure according to Example 1 exhibits at least twice and at most seven times high photoluminescence enhancement factor of the quantum dots (when light is irradiated in the x direction). According to these results, the nanostructure of Example 1 is prepared by stacking an about 4 nm thick silica layer and then, adsorbing the quantum dots therein.

On the other hand, FIG. 3 shows electric field distributions of the nanostructure of Example 1 and the nanostructure of Comparative Example 1 at the highest photoluminescence enhancement factor through the Finite Element Method (FEM)/Boundary Element Method (BEM) simulation. Referring to FIG. 3, the electric field distribution ((a) of FIG. 3) according to the nanostructure of Example 1 is much higher than that ((b) of FIG. 3) of the nanostructure having no metal shell according to Comparative Example 1. In other words, the nanostructure according to an embodiment exhibits significantly high electric field enhancement effects, as plasmonic effects are concentrated on the dielectric layer between metal core and metal shell due to the structural characteristics, thereby increasing exciton energy of the quantum dots in the dielectric layer and exhibiting high photoluminescence effects, that is, photoluminescence enhancement effects.

Preparation Example 1: Preparation of Nanostructure-Polymer Composite and Pattern Thereof (1) Preparation of Nanostructure-Binder Dispersion The quantum dots of Example 1 are dispersed in chloroform, preparing chloroform dispersion, and this chloroform dispersion is mixed with a binder (quaternary copolymer of methacrylic acid, benzyl methacrylate, hydroxyethylmethacrylate, and styrene, acid value: 130 milligrams of potassium hydroxide per gram (mg KOH/g), molecular weight: 8,000) solution (in propylene glycol monomethyl ether acetate at a concentration of 30 weight percent (wt %)), preparing nanostructure-binder dispersion.

(2) Preparation of Photosensitive Composition

A composition is prepared by adding hexaacrylate having the following structure as a photopolymerizable monomer, glycoldi-3-mercaptopropionate (hereinafter, 2T), an oxime ester compound as an initiator, $TiO_2$ as a light diffusing agent, and propylene glycol methyl ether acetate (PGMEA) to the nanostructure-binder dispersion.

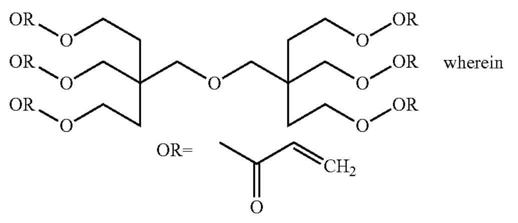

The composition includes 42 wt % of the nanostructures, 3 wt % of $TiO_2$, 25 wt % of 2T, 12 wt % of the photopolymerizable monomer, and 0.5 wt % of the initiator based on the total solid content (TSC), wherein the total solid content (TSC) is 25 wt %.

(3) Preparation and Analysis of Characteristics of Nanostructure-Polymer Composite Patterns The photosensitive composition prepared in the (2) is spin-coated on a glass substrate at 150 revolutions per minute (rpm) for 5 seconds, obtaining a film. The film is prebaked (PRB) at 100° C. for 2 minutes. The prebaked film is irradiated with light (wavelength: 365 nm, intensity: 100 millijoules (mJ)) for 1 second under a mask having a predetermined pattern (e.g., square dot or stripe pattern) and post-baked (POB) at 180° C. for 30 minutes. Subsequently, the film is developed with a potassium hydroxide aqueous solution (concentration: 0.043%) for 50 seconds, obtaining a patterned nanostructure-polymer composite film (e.g., quantum dot (QD) color filter (C/F) film) having a thickness of about 10 micrometers (μm).

The film is measured with respect to a photoluminescence spectrum (PL) for an excitation wavelength of 450 nm by using a Hitachi F-7000 spectrometer, from which an emission peak wavelength and a full width at half maximum (FWHM) are measured. In addition, the film is measured with respect to blue light absorption and light conversion efficiency by using a quantum efficiency-measuring system (Otsuka QE-2100, Otsuka Electronics Co., Ltd.).

Furthermore, the nanostructure-polymer composite film is dissolved in nitric acid, hydrobromic acid, or hydrofluoric acid into a solution and then, analyzed by inductively coupled plasma (ICP) spectroscopy to measure each element content.

Preparation Example 2: Manufacture of Display Panel

A display panel may be manufactured by applying the nanostructure-polymer composite according to Preparation Example 1 to a green pixel or a red pixel in a color conversion panel and a film including the other components except for the quantum dots to a light transmitting layer transmitting the excitation light, blue light.

While this disclosure has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

What is claimed is:

1. A nanostructure, comprising
a metal core,
a metal shell surrounding the metal core, and
a dielectric layer disposed between the metal core and the metal shell, the dielectric layer comprising a quantum dot,
wherein a size of the metal core is 15 nanometers to 50 nanometers, a thickness of the dielectric layer is 10 nanometers to 50 nanometers, and a thickness of the metal shell is 25 nanometers to 50 nanometers.

2. The nanostructure of claim 1, wherein the metal core and the metal shell each independently comprise gold, silver, platinum, copper, palladium, aluminum, or an alloy of two or more thereof.

3. The nanostructure of claim 1, wherein the dielectric layer further comprises a metal oxide or an organic polymer.

4. The nanostructure of claim 3, wherein the dielectric layer further comprises a metal oxide, and the metal oxide comprises $SiO_2$, $TiO_2$, $ZrO_2$, $Al_2O_3$, $Cu_xO$, wherein $0<x<2$, or a combination thereof.

5. The nanostructure of claim 1, wherein the quantum dot has an emission peak wavelength of 510 nanometers to 550 nanometers, or of 600 nanometers to 650 nanometers.

6. The nanostructure of claim 1, wherein the nanostructure has an absorption peak or absorption edge in the wavelength range of 400 nanometers to 550 nanometers.

7. The nanostructure of claim 1, wherein the quantum dot comprises a Group 3 element and a Group 5 element of the periodic table of elements and does not comprise cadmium.

8. The nanostructure of claim 7, wherein the quantum dot has a core-shell structure comprising a core comprising the Group 3 element and the Group 5 element of the periodic table of elements, and a shell disposed on the core, the shell comprising a Group 2 element and a Group 6 element of the periodic table of elements.

9. The nanostructure of claim 1, wherein the quantum dot has a core-shell structure comprising a core comprising a semiconductor nanocrystal comprising indium and phosphorus, and a shell disposed on the core, the shell comprising a semiconductor nanocrystal comprising zinc and selenium.

10. The nanostructure of claim 9, wherein the shell further comprises sulfur.

11. The nanostructure of claim 1, wherein the quantum dot comprises an organic ligand on a surface thereof, and the organic ligand comprises a compound comprising a carboxyl group at a terminal end thereof, a compound having a hydroxy group at a terminal end thereof, or a combination thereof.

12. The nanostructure of claim 1, wherein an average particle size of the quantum dot is greater than or equal to 5.5 nanometers.

13. A composite, comprising
a polymer matrix and
a plurality of nanostructures dispersed in the polymer matrix,
wherein the plurality of nanostructures comprise the nanostructure of claim 1.

14. A display panel, comprising
a color conversion layer comprising a plurality of regions comprising a color conversion region, and
the composite of claim 13 disposed in the color conversion region.

15. The display panel of claim 14, wherein the display panel further comprises a light emitting panel comprising a light emitting source, and the color conversion region comprises a first color conversion region configured to convert light emitted from the light emitting panel into light having a first emission spectrum.

16. The display panel of claim 15, wherein the color conversion region further comprises a second color conversion region configured to convert light emitted from the light emitting panel into light having a second emission spectrum different from the first emission spectrum.

17. The display panel of claim 16, wherein the first emission spectrum is a green emission spectrum having an emission peak wavelength between 500 nanometers and 550 nanometers, and the second emission spectrum is a red emission spectrum having an emission peak wavelength between 600 nanometers and 650 nanometers.

18. An electronic device comprising the display panel of claim 14.

* * * * *